(12) United States Patent
Urano et al.

(10) Patent No.: US 10,919,918 B2
(45) Date of Patent: Feb. 16, 2021

(54) TETRACARBOXYLIC DIANHYDRIDE, POLYIMIDE RESIN AND METHOD FOR PRODUCING THE SAME, PHOTOSENSITIVE RESIN COMPOSITIONS, PATTERNING PROCESS, METHOD FOR FORMING CURED FILM, INTERLAYER INSULATING FILM, SURFACE PROTECTIVE FILM, AND ELECTRONIC PARTS

(71) Applicant: SHIN-ETSU CHEMICAL CO., LTD., Tokyo (JP)

(72) Inventors: Hiroyuki Urano, Joetsu (JP); Hiroki Takano, Joetsu (JP); Masashi Iio, Joetsu (JP); Katsuya Takemura, Joetsu (JP); Kazuya Honda, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 200 days.

(21) Appl. No.: 16/196,281

(22) Filed: Nov. 20, 2018

(65) Prior Publication Data

US 2019/0169211 A1 Jun. 6, 2019

(30) Foreign Application Priority Data

Dec. 5, 2017 (JP) .................................. 2017-233394

(51) Int. Cl.
| | | |
|---|---|---|
| *C07F 7/08* | (2006.01) | |
| *C08G 73/10* | (2006.01) | |
| *G03F 7/039* | (2006.01) | |
| *G03F 7/038* | (2006.01) | |
| *C08G 77/46* | (2006.01) | |
| *G03F 7/075* | (2006.01) | |
| *G03F 7/023* | (2006.01) | |
| *C08G 77/04* | (2006.01) | |
| *C09D 179/08* | (2006.01) | |
| *G03F 7/32* | (2006.01) | |
| *G03F 7/16* | (2006.01) | |
| *G03F 7/20* | (2006.01) | |

(52) U.S. Cl.
CPC .......... *C07F 7/0814* (2013.01); *C08G 73/106* (2013.01); *C08G 73/1007* (2013.01); *C08G 73/1039* (2013.01); *C08G 73/1042* (2013.01); *C08G 73/1046* (2013.01); *C08G 73/1053* (2013.01); *C08G 73/1078* (2013.01); *C08G 73/1085* (2013.01); *C08G 77/045* (2013.01); *C08G 77/46* (2013.01); *C09D 179/08* (2013.01); *G03F 7/0233* (2013.01); *G03F 7/038* (2013.01); *G03F 7/039* (2013.01); *G03F 7/0387* (2013.01); *G03F 7/0757* (2013.01); *G03F 7/16* (2013.01); *G03F 7/20* (2013.01); *G03F 7/322* (2013.01)

(58) Field of Classification Search
CPC ...... C07F 7/0233; C07F 7/038; C07F 7/0757; C07F 7/0814; C08G 73/106; C08G 73/1007; C08G 73/1039; C08G 73/1042; C08G 73/1046; C08G 73/1053; C08G 73/1064; C08G 73/1078; C08G 77/045; C08G 77/46; C09D 179/08; G03F 7/0233; G03F 7/038; G03F 7/0387; G03F 7/039; G03F 7/16; G03F 7/20; G03F 7/322

See application file for complete search history.

(56) References Cited

U.S. PATENT DOCUMENTS

| | | | |
|---|---|---|---|
| 3,159,601 A | 12/1964 | Ashby et al. | |
| 3,159,662 A | 12/1964 | Ashby et al. | |
| 3,220,972 A | 11/1965 | Lamoreaux | |
| 3,775,452 A | 11/1973 | Karstedt et al. | |
| 3,803,085 A * | 4/1974 | Takehoshi et al. | ......................... C08G 73/1042 528/26 |
| 3,957,512 A | 5/1976 | Kleeberg et al. | |
| 4,404,350 A * | 9/1983 | Ryang | .................. C08G 73/106 528/26 |
| 4,595,732 A | 6/1986 | Ryang | |
| 4,847,358 A * | 7/1989 | Kojima | ................ C08G 73/106 528/353 |

(Continued)

FOREIGN PATENT DOCUMENTS

| | | |
|---|---|---|
| JP | S49-115541 A | 11/1974 |
| JP | S55-045746 A | 3/1980 |

(Continued)

OTHER PUBLICATIONS

May 9, 2019 Extended Search Report issued in European Application No. 18208547.2.

(Continued)

*Primary Examiner* — Anca Eoff
(74) *Attorney, Agent, or Firm* — Oliff PLC

(57) ABSTRACT

An object of the present invention is to provide: a tetracarboxylic dianhydride which can lead to a polyimide usable as a base resin of a photosensitive resin composition capable of forming a fine pattern and obtaining high resolution without impairing excellent characteristics such as mechanical strength and adhesiveness; a polyimide resin obtained by using the tetracarboxylic dianhydride; and a method for producing the polyimide resin. The tetracarboxylic dianhydride is shown by the following general formula (1).

(1)

$$\begin{array}{c}\text{structural formula showing tetracarboxylic dianhydride with siloxane linkages, R}^1\text{, R}^2\text{, R}^3\text{, R}^4\text{, R}^5\text{ substituents and Z group}\end{array}$$

20 Claims, 1 Drawing Sheet

(56) References Cited

U.S. PATENT DOCUMENTS

| | | | |
|---|---|---|---|
| 5,117,001 A * | 5/1992 | Okinoshima | C08G 77/045 549/214 |
| 6,001,534 A | 12/1999 | Kato | |
| 8,263,308 B2 * | 9/2012 | Tagami | G03F 7/0382 430/270.1 |
| 2005/0170254 A1 | 8/2005 | West et al. | |
| 2010/0233619 A1 | 9/2010 | Tagami et al. | |
| 2011/0143103 A1 | 6/2011 | Furuya et al. | |
| 2015/0219991 A1 | 8/2015 | Masuda et al. | |
| 2017/0298186 A1 | 10/2017 | Takemura et al. | |

FOREIGN PATENT DOCUMENTS

| | | |
|---|---|---|
| JP | 3232022 B2 | 11/2001 |
| JP | 2008-224984 A | 9/2008 |
| JP | 5417623 B2 | 2/2014 |
| KR | 10-2010-0103393 A | 9/2010 |
| KR | 10-2010-0125467 A | 11/2010 |
| TW | 201136997 A | 11/2011 |
| TW | 201536860 A | 10/2015 |
| TW | 201738198 A | 11/2017 |
| WO | 2014/045434 A1 | 3/2014 |

OTHER PUBLICATIONS

May 31, 2019 Office Action issued in Taiwanese Application No. 107143209.

May 19, 2019 Search Report issued in Taiwanese Application No. 107143209.

Jan. 6, 2020 Office Action issued in Korean Patent Application No. 10-2018-0154393.

* cited by examiner

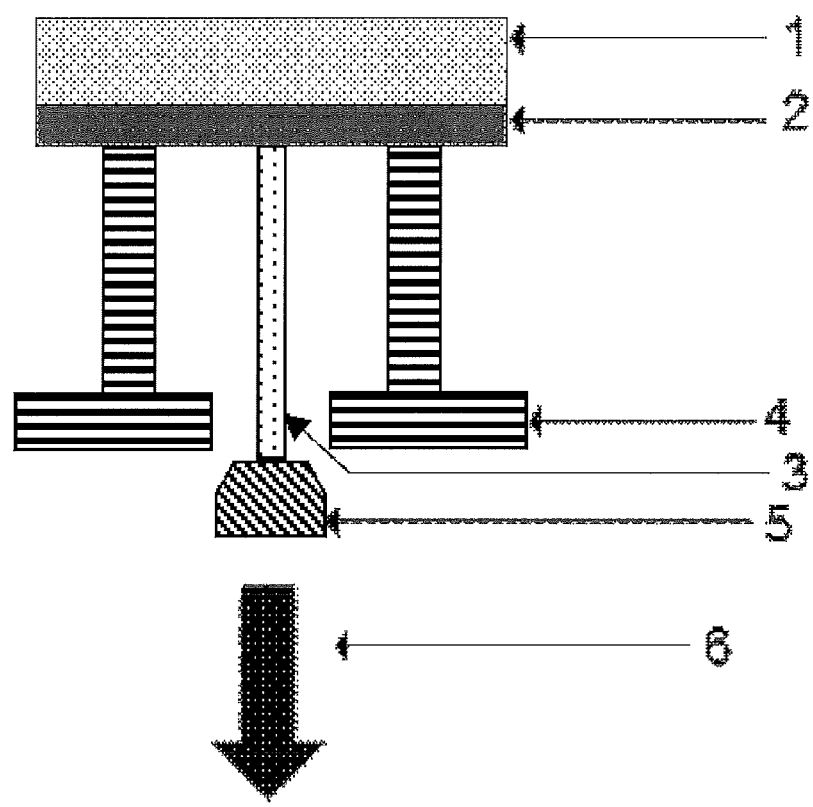

TETRACARBOXYLIC DIANHYDRIDE, POLYIMIDE RESIN AND METHOD FOR PRODUCING THE SAME, PHOTOSENSITIVE RESIN COMPOSITIONS, PATTERNING PROCESS, METHOD FOR FORMING CURED FILM, INTERLAYER INSULATING FILM, SURFACE PROTECTIVE FILM, AND ELECTRONIC PARTS

CROSS-REFERENCE TO RELATED APPLICATION

This application claims priority to JP 2017-233394 filed Dec. 5, 2017. The disclosure of the prior application is hereby incorporated by reference herein in its entirety.

TECHNICAL FIELD

The present invention relates to a tetracarboxylic dianhydride useful as a structural unit of a polyimide resin, a polyimide resin obtained by using the tetracarboxylic dianhydride and a method for producing the polyimide resin, a positive type photosensitive resin composition or a negative type photosensitive resin composition which use the polyimide resin as a base resin, patterning processes using these photosensitive resin compositions and capable of development with an aqueous alkaline solution, and a method for forming a cured film. Further, the present invention relates to an interlayer insulating film, a surface protective film, and an electronic part which use this cured film.

BACKGROUND ART

Along with miniaturization and performance improvement of various electronic devices such as personal computers, digital cameras, and cellular phones, demands for further downsizing, thinning and high density in semiconductor devices are also rapidly increasing. For this reason, in order to cope with an increase in a substrate area in improvement of productivity, and in a high-density packaging technology such as a chip size package or a chip scale package (CSP) or three-dimensional lamination, development of fine photosensitive insulation materials with high aspect ratio on substrates has been desired.

In the high-density packaging technology such as three-dimensional lamination, a polyimide-based material and a polybenzoxazole-based material have been conventionally utilized as a protective film or insulating layer for a photosensitive insulating material which can form a pattern on a substrate. The insulating property, mechanical characteristics such as strechability and strength, adhesiveness to the substrate, and so forth keep drawing attention, so that the development is still active even now.

Heretofore, as the photosensitive polyimide-based material, materials utilizing a polyamic acid which is a precursor of polyimide have been proposed, for example, a material obtained by introducing a photosensitive group into a carboxyl group of the polyamic acid by an ester bond (Patent Literatures 1 and 2). In these proposals, after a patterned film is formed, an imidization treatment at a high temperature exceeding 300° C. is indispensable to obtain an objective polyimide film.

However, due to recent demands for reducing thermal load to devices, reducing stress on the substrates, and so forth, a polyimide-based material or polybenzoxazole-based material curable at a low temperature of 250° C. or less, further preferably 200° C. or less, is desired.

As a low-temperature curable resin composition, a photosensitive polyimide resin composition using an imidized solvent-soluble resin has been proposed (Patent Literatures 3 and 4). The negative type photosensitive resin composition using the polyimide described in Patent Literature 3 is subjected to development using N-methyl-2-pyrrolidone (NMP) in pattern formation. However, in Patent Literature 3, there is no specific description about the resolution performance in pattern formation.

Meanwhile, the photosensitive resin composition proposed in Patent Literature 4 uses an imidized base resin which is synthesized using a tetracarboxylic dianhydride having a long-chain siloxane bond and constructed in consideration of low-temperature curing. The solvent of this composition is cyclopentanone, and an aqueous alkaline solution is used in the developing process. However, the resolution performance still needs to be improved. That is, the pattern formation using the photosensitive resin composition described in Patent Literature 4 is carried out with an ultrathin film, and the size of the pattern to be resolved is also large. This insufficiency of the resolution performance is due to poor solubility of the polyimide resin, which is a base resin disclosed in Patent Literature 4, in an aqueous alkaline solution used for the developing solution. To heighten the solubility in the developing solution is a key for improving the resolution performance in the pattern formation. In addition, since the base resin disclosed in Patent Literature 4 contains the long-chain siloxane in the polyimide, the strechability and mechanical strength are not sufficient, and the resistance determined in a reliability test such as impact resistance test is poor.

As the resolution performance of the photosensitive insulating material in the high-density packaging technology such as a three-dimensional lamination which has been demanded recently, the aspect ratio of the formed pattern (finished film thickness (or height of the pattern)/dimension of the pattern) is required to be 1 or more and 2 or so. That is, when desired finished film thickness or height of the pattern is 10 μm, a dimension of 10 μm or less or a pattern of near 5 μm must be formed.

Additionally, as the low-temperature curable resin composition, a polybenzoxazole precursor synthesized using a dicarboxylic acid having an aliphatic group has been proposed (Patent Literature 5). Nevertheless, although low-temperature curing is possible, the low-stress property is insufficient because the film shrinks greatly due to dehydrative cyclization. Moreover, since the polybenzoxazole precursor has many aliphatic groups which do not interact with metal, the adhesiveness to metal such as copper is also insufficient.

Meanwhile, as the low-temperature curable resin composition, a photosensitive resin composition using an alkali-soluble polyimide containing a diamine residue having a polyalkylene oxide group and a carboxylic acid residue having a polyalkylene oxide group has been proposed (Patent Literature 6). However, the aspect ratio of the pattern formed by using the photosensitive resin composition described in Patent Literature 6 is less than 1 in many cases, and the resolution performance still needs to be improved. This insufficiency of the resolution performance is due to poor solubility of the polyimide resin, which is a base resin disclosed in Patent Literature 6, into an aqueous alkaline solution used for the developing solution. This is because the polyimide is synthesized by using the diamine having a polyalkylene oxide group, so that the unit ratio of a diamine having an alkali-soluble group has to be lowered. Moreover, the acid anhydride having a polyalkylene oxide group described in Patent Literature 6 is merely an acid anhydride obtained by reacting the diamine having a polyalkylene oxide group with trimellitic anhydride. Accordingly, the unit ratio of the diamine having an alkali-soluble group in the polyimide synthesized by using this acid anhydride having a polyalkylene oxide group is lowered as in the case of using the diamine having a polyalkylene oxide group.

Thus, accompanied by high densification and high integration of the chips, miniaturization of the pattern in the rewiring technology for the insulating protective film is expected to be promoted more and more in the future, so that as the photosensitive resin composition using a polyimide resin, a composition which can realize high resolution without impairing excellent characteristics of a pattern of the polyimide obtained by heating and mechanical strength, adhesiveness, etc. of the protective film has been strongly desired.

It has also been strongly desired that the insulating protective film subjected to patterning and curing has heat resistance in various processes and resistance to various chemicals to be used.

That is, rapid development of the photosensitive resin composition having all of these features without lacking any of these has been desired.

CITATION LIST

Patent Literatures

Patent Literature 1: Japanese Unexamined Patent Application Publication No. S49-115541

Patent Literature 2: Japanese Unexamined Patent Application Publication No. S55-45746

Patent Literature 3: Japanese Patent No. 3232022

Patent Literature 4: Japanese Patent No. 5417623

Patent Literature 5: Japanese Unexamined Patent Application Publication No. 2008-224984

Patent Literature 6: WO2014/045434

SUMMARY OF THE INVENTION

Technical Problem

The present invention has been made in view of the above circumstances. An object of the present invention is to provide: a tetracarboxylic dianhydride which can lead to a polyimide usable as a base resin of a photosensitive resin composition capable of forming a fine pattern and obtaining high resolution without impairing excellent characteristics such as mechanical strength and adhesiveness; a polyimide resin obtained by using the tetracarboxylic dianhydride; and a method for producing the polyimide resin. Moreover, another object is to provide a positive type photosensitive resin composition and a negative type photosensitive resin composition which use the polyimide resin and are soluble in an aqueous alkaline solution, excellent in resolution, and capable of forming a fine pattern in pattern formation.

Solution to Problem

To accomplish the above objects, the present invention provides a tetracarboxylic dianhydride shown by the following general formula (1),

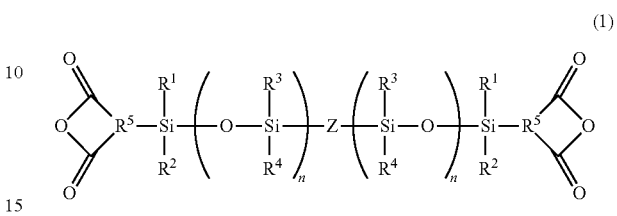

wherein Z represents a linear or branched divalent hydrocarbon group having 4 to 100 carbon atoms optionally containing an oxygen atom therein; $R^1$ to $R^4$ each represent an identical or different monovalent hydrocarbon group having 1 to 8 carbon atoms; $R^5$ represents a trivalent organic group; and "n" represents an integer of 1 to 100.

It is noted that, herein, the term organic group refers to a group containing at least a carbon atom, and may further contain an oxygen atom, a hydrogen atom, a fluorine atom, and another atom(s), if necessary.

Such a tetracarboxylic dianhydride makes it possible to obtain a polyimide resin useful as a base resin of a photosensitive resin composition capable of obtaining high resolution, the polyimide resin having excellent electric characteristics, mechanical characteristics, and adhesiveness, as well as enhanced solubility into an aqueous alkaline solution as a developing solution in patterning.

Here, R5 in the general formula (1) is preferably shown by the following general formula (2) or (3),

wherein R6 represents a methylene group or an oxygen atom, and

wherein R7 represents a linear or branched alkylene group or alkenylene group having 3 to 15 carbon atoms.

$R^5$ in the general formula (1) is preferably such a group because of availability of the raw material compound.

Furthermore, Z in the general formula (1) is preferably a divalent organic group shown by the following general formula (4),

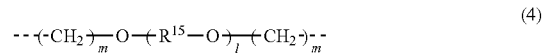

wherein $R^{15}$ represents a linear or branched alkylene group having 2 to 15 carbon atoms; "l" represents an integer of 1 to 50; and "m" represents an integer of 2 to 15.

When Z in the general formula (1) is such a group, a cured film with low stress, high stretchability, and high adhesiveness to metal can be obtained.

Moreover, the present invention provides a polyimide resin comprising a structural unit shown by the following general formula (5),

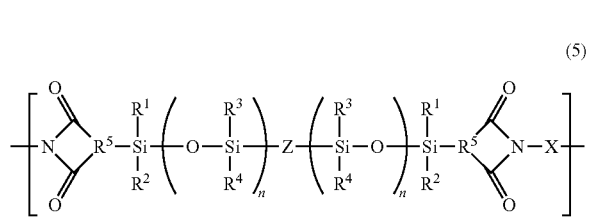

(5)

wherein Z represents a linear or branched divalent hydrocarbon group having 4 to 100 carbon atoms optionally containing an oxygen atom therein; $R^1$ to $R^4$ each represent an identical or different monovalent hydrocarbon group having 1 to 8 carbon atoms; $R^5$ represents a trivalent organic group; "n" represents an integer of 1 to 100; and X represents a divalent organic group.

The polyimide resin comprising such a structural unit has excellent electric characteristics, mechanical characteristics, adhesiveness, and so forth, and is usable as a base resin of a photosensitive resin composition capable of forming a fine pattern and obtaining high resolution.

Here, X in the general formula (5) is preferably a divalent organic group shown by the following general formula (6),

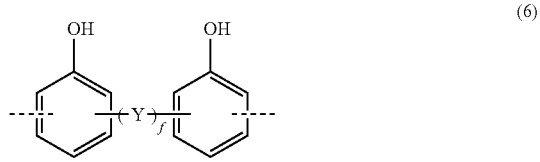

(6)

wherein "f" represents 0 or 1; Y represents a divalent bonding group; and f=0 represents direct bonding without a bonding group.

Such a divalent organic group can increase the solubility into an aqueous alkaline solution of a developing solution in pattern formation of a photosensitive resin composition using a base resin made of the polyimide resin comprising the structural unit shown by the general formula (5).

Furthermore, Y in the general formula (6) is preferably a divalent group (bonding group) shown by the following formula (7) or (8),

(7)

(8)

When such a material is employed, the effects of the present invention can be sufficiently obtained.

In addition, the present invention provides a method for producing the polyimide resin containing the structural unit shown by the general formula (5), the method comprising reacting a tetracarboxylic dianhydride shown by the following general formula (1) with a diamine shown by the following general formula (9),

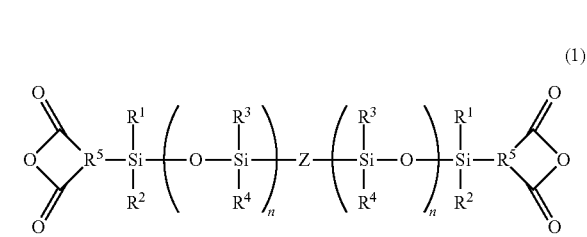

(1)

wherein Z, $R^1$ to $R^5$, and n are as defined above, and

(9)

wherein X is as defined above.

The polyimide resin containing the structural unit shown by the general formula (5) can be produced by such a method, as an example.

Further, the present invention provides a positive type photosensitive resin composition comprising:

(A) the polyimide resin comprising the structural unit shown by the general formula (5);

(B) a photosensitive agent which generates an acid by light to increase a dissolution rate in an aqueous alkaline solution and is a compound having a quinonediazide structure; and (D) a solvent.

Additionally, the present invention provides a positive type photosensitive resin composition comprising:

(A) the polyimide resin comprising the structural unit shown by the general formula (5);

(B) a photosensitive agent which generates an acid by light to increase a dissolution rate in an aqueous alkaline solution and is a compound having a quinonediazide structure;

(C) at least one of a crosslinking agent(s) selected from an amino condensate modified by formaldehyde or formaldehyde-alcohol, a phenol compound having two or more methylol groups or alkoxymethylol groups in one molecule on average, a compound in which a hydrogen atom of a hydroxyl group of a polyvalent phenol is substituted by a glycidyl group or a group having a glycidyl group, a compound in which a hydrogen atom of a hydroxyl group of a polyvalent phenol is substituted by a substituent shown by the following formula (C-1), and a compound containing two or more groups each shown by the following formula (C-2) or (C-2'),

(C-1)

(C-2)

-continued

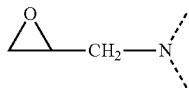
(C-2')

wherein a dotted line represents a bond; Rc represents a linear, branched, or cyclic alkyl group having 1 to 6 carbon atoms; and "s" represents 1 or 2; and (D) a solvent.

Thus, by using the photosensitive agent of the component (B), in pattern formation, the exposed portion becomes soluble by increasing the dissolution rate in a developing solution of an aqueous alkaline solution, whereas the unexposed portion does not dissolve because of the photosensitive agent, which inhibits the dissolution in alkali, to consequently give a positive image. In the polyimide resin comprising the structural unit shown by the general formula (5), the resin per se exhibits alkali solubility, so that residues such as scum and pattern deterioration such as trailing hardly occur at the bottom of the opened pattern, which act dominantly for fine pattern formation.

Further, the present invention provides a negative type photosensitive resin composition comprising:

(A') the polyimide resin comprising the structural unit shown by the general formula (5);

(B') a photoacid generator;

(C') at least one of a crosslinking agent(s) selected from an amino condensate modified by formaldehyde or formaldehyde-alcohol, a phenol compound having two or more methylol groups or alkoxymethylol groups in one molecule on average, a compound in which a hydrogen atom of a hydroxyl group of a polyvalent phenol is substituted by a glycidyl group or a group having a glycidyl group, a compound in which a hydrogen atom of a hydroxyl group of a polyvalent phenol is substituted by a substituent shown by the following formula (C-1), and a compound containing two or more groups each shown by the following formula (C-2) or (C-2'),

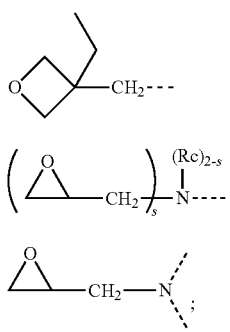

and (D) a solvent.

Thus, by using the photoacid generator of the component (B'), in the pattern formation, an acid is generated in the exposed portion, and a crosslinking group of the crosslinking agent of the added component (C') is crosslinked with a crosslinking reaction point of the polymer whereby a composition for obtaining a negative image which is insoluble in a developing solution can also be prepared.

Further, the present invention provides a patterning process comprising the steps of:

(1) coating the above-described positive type photosensitive resin composition onto a substrate to form a film of a photosensitive material;

(2) after heat treatment, exposing the film of the photosensitive material by a high energy beam with a wavelength of 190 to 500 nm or an electron beam through a photomask; and (3) developing the film using a developing solution of an aqueous alkaline solution.

Thus, in the positive type photosensitive resin composition of the present invention, it is possible to carry out development by an alkali using an aqueous alkaline solution.

Furthermore, the present invention provides a patterning process comprising the steps of:

(I) coating the above-described negative type photosensitive resin composition onto a substrate to form a film of a photosensitive material;

(II) after heat treatment, exposing the film of the photosensitive material by a high energy beam with a wavelength of 190 to 500 nm or an electron beam through a photomask; and (III) developing the film using a developing solution of an aqueous alkaline solution.

Since the polyimide resin which is a base resin of the negative type photosensitive resin composition according to the present invention contains the structural unit shown by the general formula (5), it is possible to carry out development by an alkali using an aqueous alkaline solution.

In this case, the process preferably comprises a heating step after the exposure between the step (II) and the step (III).

Particularly, in a case of a negative type photosensitive resin composition comprising a polymer containing the polyimide resin containing the structural unit shown by the general formula (5), involving the heating step after the exposure (post-exposure baking (PEB)) can promote a crosslinking reaction between the crosslinking group of the crosslinking agent and the crosslinking reaction point of the polymer by using an acid, as a catalyst, which is generated from the photoacid generator by the exposure.

Moreover, the present invention provides a method for forming a cured film, comprising heating and post-curing the patterned film obtained by the above-described patterning processes, at a temperature of 100 to 300° C.

Further, the present invention provides an interlayer insulating film comprising a cured film in which the above-described positive type photosensitive resin composition or negative type photosensitive resin composition has cured.

Furthermore, the present invention provides a surface protective film comprising a cured film in which the above-described positive type photosensitive resin composition or negative type photosensitive resin composition has cured.

Furthermore, the present invention provides an electronic part comprising the above-described interlayer insulating film or surface protective film.

The polyimide resin of the present invention comprises the structural unit shown by the general formula (5) and accordingly has excellent electric characteristics, mechanical characteristics; and adhesiveness, is soluble in an alkaline developing solution and capable of forming a fine pattern and obtaining high resolution. Moreover, such patterned cured films can serve as excellent protective films and insulating protective films for electric and electronic parts. Additionally, electronic parts having these cured films can be provided.

Advantageous Effects of Invention

The tetracarboxylic dianhydride of the present invention makes it possible to provide a tetracarboxylic dianhydride to obtain a polyimide resin usable as a base resin of a photosensitive resin composition. In pattern formation using a photosensitive resin composition containing the polyimide resin obtained from such a tetracarboxylic dianhydride, it is possible to carry out development using an aqueous alkaline solution. A polymer having the structural unit of the polyimide precursor according to the present invention is soluble in an aqueous alkaline solution, so that residues such as scum and pattern deterioration such as trailing can be suppressed at the bottom of the opened pattern, and it is possible to resolve fine patterns.

Furthermore, a cured film obtained from the positive type photosensitive resin composition or the negative type photosensitive resin composition of the present invention is a protective film excellent in mechanical strength, substrate adhesiveness, electric characteristics, and reliability which are characteristics of polyimide.

BRIEF DESCRIPTION OF DRAWINGS

The FIGURE is an explanatory view for illustrating an adhesive force measurement method in Examples.

DESCRIPTION OF EMBODIMENTS

As described above, there have been demands for a tetracarboxylic dianhydride capable of obtaining a polyimide resin usable as a base resin of a photosensitive resin composition capable of development with an aqueous alkaline solution and having sufficiently high solubility in a developing solution, thereby enabling resolution improvement and fine pattern formation.

The present inventors have intensively studied to accomplish the objects. As a result, the inventors have found that when a polyimide resin obtained by using a tetracarboxylic dianhydride shown by the following general formula (1) is used as a base resin of a photosensitive resin composition, such a polyimide resin is soluble in a developing solution of an aqueous alkaline solution, so that the polyimide resin is utilizable in both a positive type photosensitive resin composition capable of development with an aqueous alkaline solution and a negative type photosensitive resin composition capable of development with an aqueous alkaline solution, and patterns obtained by using these photosensitive resin compositions are fine and have good pattern shapes.

Further, the inventors have found that a protective film obtained through patterning and heating by using such a photosensitive resin composition containing the polyimide resin as a base resin is excellent in electric characteristics, mechanical characteristics, and adhesiveness. Specifically, the inventors have found that a cured film obtained to have a pattern formed by using a photosensitive resin composition containing the polyimide resin as a base resin is excellent as a protective film and an insulating protective film for electric and electronic parts. These findings have led to the completion of the present invention.

That is, the present invention is a tetracarboxylic dianhydride shown by the following general formula (1),

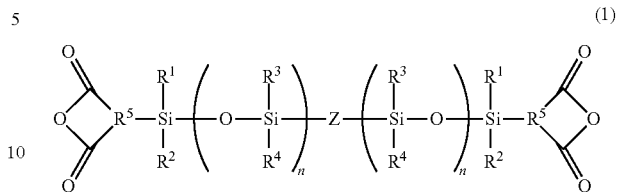

wherein Z represents a linear or branched divalent hydrocarbon group having 4 to 100 carbon atoms optionally containing an oxygen atom therein; $R^1$ to $R^4$ each represent an identical or different monovalent hydrocarbon group having 1 to 8 carbon atoms; $R^5$ represents a trivalent organic group; and "n" represents an integer of 1 to 100.

Hereinafter, the present invention will be described in details. However, the present invention is not limited by these.

[Tetracarboxylic Dianhydride]

The tetracarboxylic dianhydride of the present invention is shown by the following general formula (1).

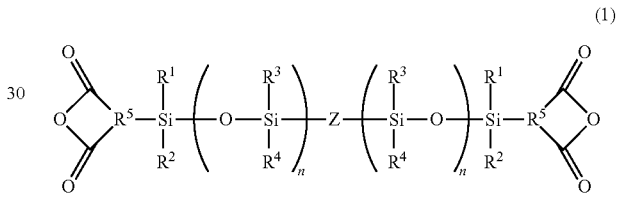

In the formula, Z represents a linear or branched divalent hydrocarbon group having 4 to 100 carbon atoms optionally containing an oxygen atom therein. $R^1$ to $R^4$ each represent an identical or different monovalent hydrocarbon group having 1 to 8 carbon atoms. $R^5$ represents a trivalent organic group. "n" represents an integer of 1 to 100.

In the general formula (1), $R^1$ to $R^4$ each represent a monovalent hydrocarbon group having 1 to 8 carbon atoms and may be the same or different from the others. $R^1$ to $R^4$ each preferably represent a monovalent hydrocarbon group having 1 to 6 carbon atoms. Specifically, the hydrocarbon group includes linear, branched or cyclic alkyl groups such as a methyl group, an ethyl group, a propyl group, an isopropyl group, an n-butyl group, a tert-butyl group, and a cyclohexyl group; linear, branched or cyclic alkenyl groups such as a vinyl group, an allyl group, a propenyl group, a butenyl group, a hexenyl group, and a cyclohexenyl group; aryl groups such as a phenyl group and a tolyl group; aralkyl groups such as a benzyl group and a phenylethyl group; and the like. "n" is an integer of 1 to 100, preferably an integer of 1 to 40, and particularly preferably an integer of 1 to 20.

In the general formula (1), $R^5$ is preferably an organic group selected from groups shown by the following general formulae (2) and (3).

In the formula, $R^6$ represents a methylene group or an oxygen atom.

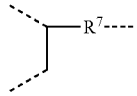
(3)

In the formula, $R^7$ represents a linear or branched alkylene group or alkenylene group having 3 to 15 carbon atoms.

As the organic group shown by the general formula (3), preferably usable organic groups specifically include the following, but are not limited by these.

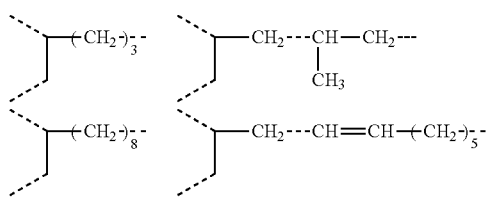

Meanwhile, Z in the general formula (1) is preferably a group shown by the following general formula (4).

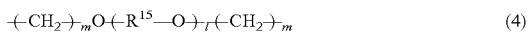
(4)

In the formula, $R^{15}$ represents a linear or branched alkylene group having 2 to 15 carbon atoms. "l" represents an integer of 1 to 50. "m" represents an integer of 2 to 15.

Moreover, as the organic group shown by the general formula (4), preferably usable organic groups specifically include the following, but are not limited by these.

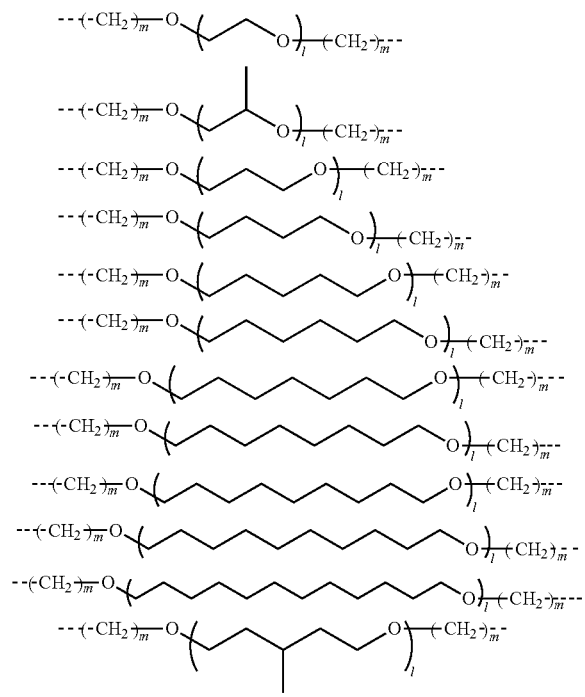

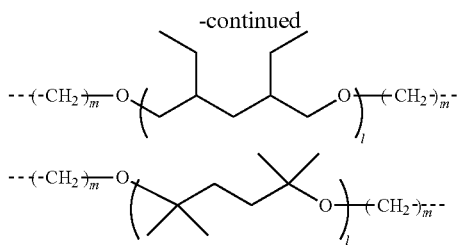

In the formulae, "l" represents an integer of 1 to 50, preferably an integer of 1 to 3, more preferably 1. "m" represents an integer of 2 to 15, preferably an integer of 2 to 3, more preferably 3.

When Z in the general formula (1) is such a group, this makes it possible to obtain a cured film with low stress, high stretchability, and high adhesiveness to metal.

(Method for Producing Tetracarboxylic Dianhydride)

In a method for producing the tetracarboxylic dianhydride of the present invention, first, an alkenyl group-containing carboxylic acid anhydride shown by the following general formula (10) or (11) and a dihydroorganosiloxane shown by the following general formula (12) are subjected to a hydrosilylation reaction in the presence of a catalyst to obtain a carboxylic acid anhydride-containing hydroorganosiloxane shown by the following general formula (13) or (14). Next, the obtained carboxylic acid anhydride-containing hydroorganosiloxane shown by the following general formula (13) or (14) and a compound containing at least two or more alkenyl groups shown by the following general formula (15) are subjected to a hydrosilylation reaction in the presence of a catalyst. Thus, the tetracarboxylic dianhydride of the present invention can be obtained.

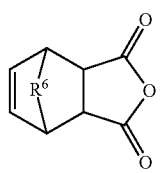
(10)

In the formula, $R^6$ is as defined above.

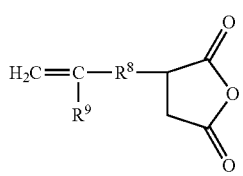
(11)

In the formula, $R^8$ represents a linear or branched alkylene group having 1 to 13 carbon atoms. $R^9$ represents a hydrogen atom or a methyl group.

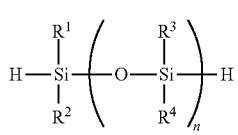
(12)

In the formula, $R^1$ to $R^4$ and "n" are as defined above.

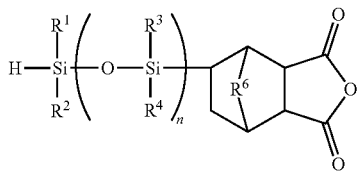

(13)

In the formula, $R^1$ to $R^4$, $R^6$, and "n" are as defined above.

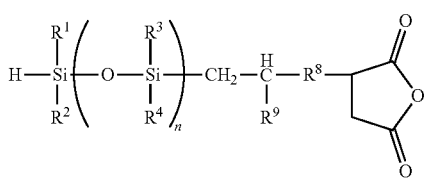

(14)

In the formula, $R^1$ to $R^4$, $R^8$, $R^9$, and "n" are as defined above.

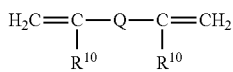

(15)

In the formula, Q represents an oxygen atom or a linear or branched divalent hydrocarbon group having 1 to 96 carbon atoms optionally containing an oxygen atom therein. $R^{10}$ represents a hydrogen atom or a monovalent hydrocarbon group having 1 to 8 carbon atoms.

Description will be given of suitable conditions for the hydrosilylation reaction between the alkenyl group-containing carboxylic acid anhydride shown by the general formula (10) or (11) and the dihydroorganosiloxane shown by the general formula (12), or between the carboxylic acid anhydride-containing hydroorganosiloxane compound shown by the general formula (13) or (14) and the compound containing at least two or more alkenyl groups shown by the general formula (15), in the presence of a catalyst.

In the hydrosilylation reactions, examples of the catalyst include platinum group metal elements such as platinum (including platinum black), rhodium, and palladium; platinum chloride, chloroplatinic acid, and chloroplatinic acid salts such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$, and $Na_2HPtCl_4 \cdot xH_2O$ (where x is preferably an integer of 0 to 6, particularly preferably 0 or 6); alcohol-modified chloroplatinic acid (U.S. Pat. No. 3,220,972); complexes of chloroplatinic acid with olefins (U.S. Pat. Nos. 3,159,601, 3,159,662, 3,775, 452); platinum group metals such as platinum black and palladium supported on supports such as alumina, silica, and carbon; rhodium-olefin complexes; chlorotris(triphenylphosphine)rhodium (what is called Wilkinson's catalyst); complexes of platinum chloride, chloroplatinic acid, or chloroplatinic acid salts with vinyl group-containing siloxanes (particularly, vinyl group-containing cyclic siloxanes); and the like. The amount thereof to be used is a catalytic amount. Normally, the amount as the platinum group metal is preferably 0.001 to 0.1 mass % based on a total amount of the reactant.

In the hydrosilylation reactions, a solvent may be used if necessary. The solvent is preferably, for example, a hydrocarbon-based solvent such as toluene and xylene. As the reaction condition, the reaction temperature is, for example, 40 to 150° C., particularly preferably 60 to 120° C., from the viewpoints of preventing the deactivation of the catalyst and enabling the polymerization to complete in a short time. Although depending on the kind and amount of the reactant, the reaction time is completed within about 0.5 to 100 hours, particularly preferably 0.5 to 30 hours, to prevent moisture from entering the reaction system. After the reaction is completed as described above, the solvent is distilled off when used. In this way, the carboxylic acid anhydride-containing hydroorganosiloxane compound shown by the general formula (13) or (14) can be prepared.

[Polyimide Resin]

A polyimide resin of the present invention comprises a structural unit shown by the following general formula (5).

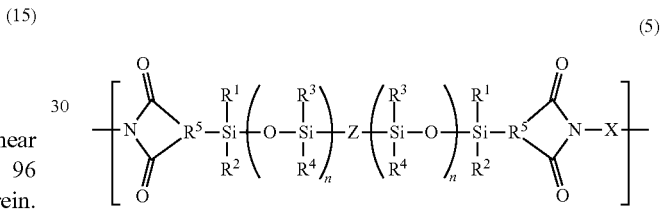

(5)

In the formula, Z, $R^1$ to $R^5$, and "n" are as defined above. X represents a divalent organic group.

In the general formula (5), Z, $R^1$ to $R^5$, and "n" are the same as those described in the formula (1).

Moreover, in the general formula (5), X is preferably a divalent organic group shown by the following general formula (6).

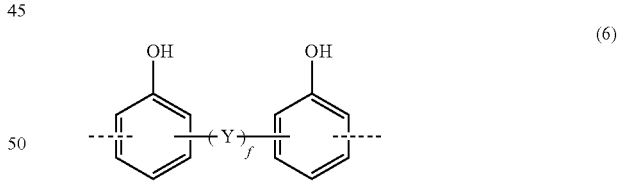

(6)

In the formula, "f" represents 0 or 1. Y represents a divalent bonding group. f=0 represents direct bonding without a bonding group.

When X in the general formula (5) is the divalent organic group shown by the general formula (6), this makes it possible to increase the solubility in an aqueous alkaline solution of a developing solution in pattern formation of a photosensitive resin composition using a base resin made of the polyimide resin containing the structural unit shown by the general formula (5).

In the general formula (6), "f" represents 0 or 1. When f=0, direct bonding is formed without the divalent bonding group Y.

On the other hand, when f=1, bonding is formed involving the divalent bonding group Y in the general formula (6). Y is not limited as long as it is a divalent group. Y is preferably a divalent organic group of an alicyclic aliphatic group or aromatic group having 4 to 40 carbon atoms, more preferably divalent bonding groups shown by following formulae (16). Additionally, the structure of Y may be one kind or a combination of two or more kinds.

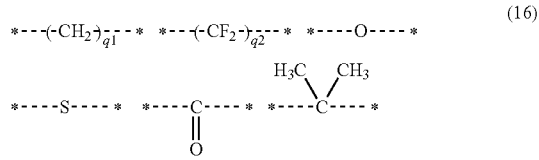

When Y in the general formula (6) is shown by the formula (7), a structural unit of the following general formula (5-1) is preferable. When Y in the general formula (6) is shown by the formula (8), a structural unit of the following general formula (5-2) is preferable.

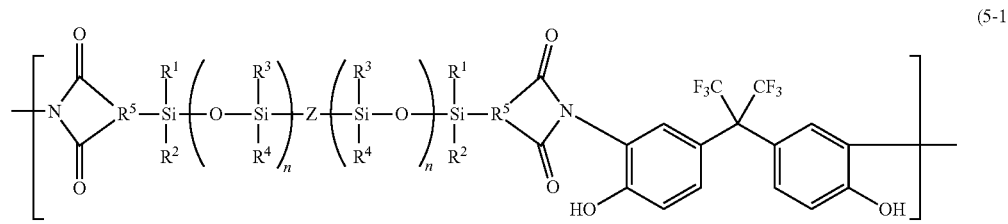

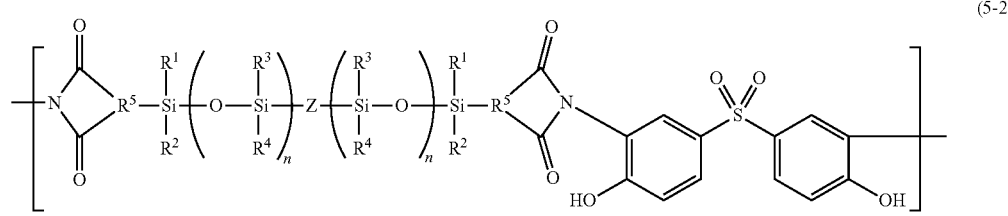

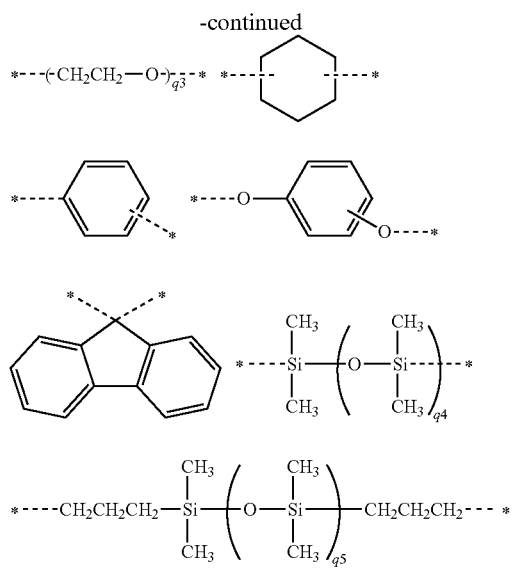

In the formulae, "$q_1$", "$q_2$" and "$q_3$" each represent an integer of 1 to 6. "$q_4$" and "$q_5$" each represent an integer of 1 to 10.

A particularly preferable divalent bonding group Y is a divalent group shown by the following formula (7) or (8).

In the formulae, $R^1$ to $R^5$, "n", and Z are as defined above.

As in the structural unit (5-1), the divalent bonding group Y is preferably a hexafluoroisopropylidene group shown by the formula (7) and positioned at the p-position of the phenolic hydroxyl group because the hexafluoroisopropylidene group attracts electrons, so that the acidity of the phenolic hydroxyl group is increased and the solubility to a developing solution of an aqueous alkaline solution is further improved.

Similarly, as in the structural unit (5-2), the divalent bonding group Y is preferably a sulfonyl group shown by the formula (8) and positioned at the p-position of the phenolic hydroxyl group because the sulfonyl group is also an electron attracting group, so that the acidity of the phenolic hydroxyl group is increased and the solubility to a developing solution of an aqueous alkaline solution is further improved.

Moreover, the polyimide resin of the present invention may further contain a structural unit shown by the following general formula (17), in addition to the structural unit shown by the general formula (5).

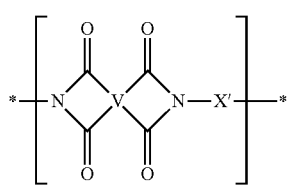
(17)

In the formula, V represents a tetravalent organic group, and X' represents a divalent group.

In the structural unit (17), V is a tetravalent organic group, and is not limited as long as it is a tetravalent organic group. V is preferably a tetravalent organic group of an alicyclic aliphatic group or aromatic group having 4 to 40 carbon atoms, further preferably tetravalent organic groups shown by the following formulae (18). Moreover, the structure of V may be one kind or a combination of two or more kinds.

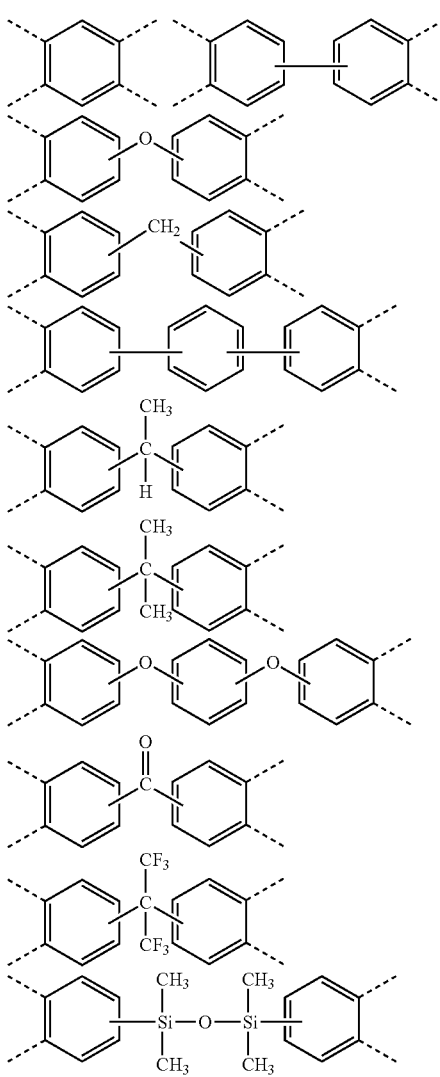
(18)

Meanwhile, X' in the structural unit (17) is a divalent group, and is not limited as long as it is a divalent group. X' is preferably a divalent group having 6 to 40 carbon atoms, more preferably a cyclic organic group containing 1 to 4 aromatic rings or alicyclic rings having a substituent(s), or an aliphatic group having no cyclic structure, or a siloxane group. Further suitable X' includes structures shown by the following formula (19), (20) or (21). In addition, the structure of X' may be one kind or a combination of two or more kinds.

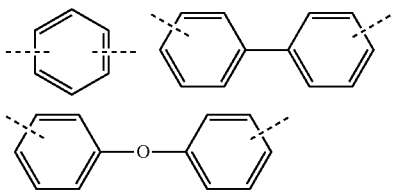
(19)

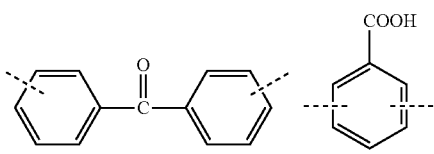

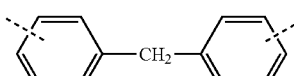

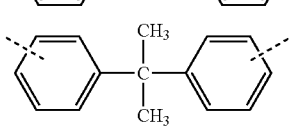

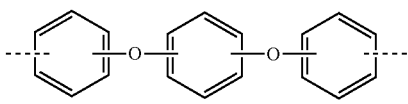

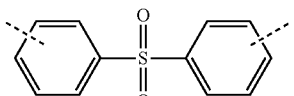

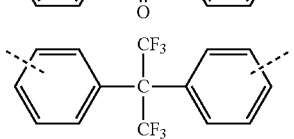

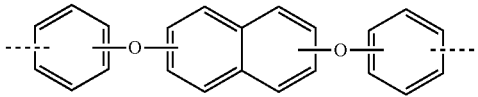

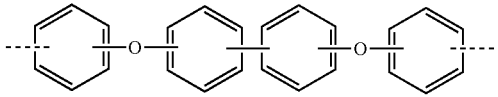

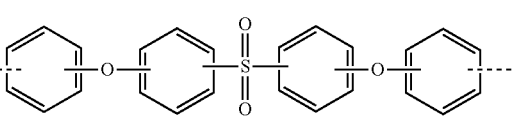

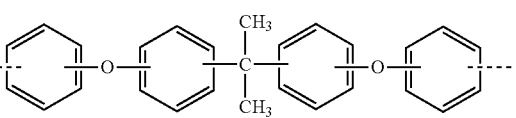

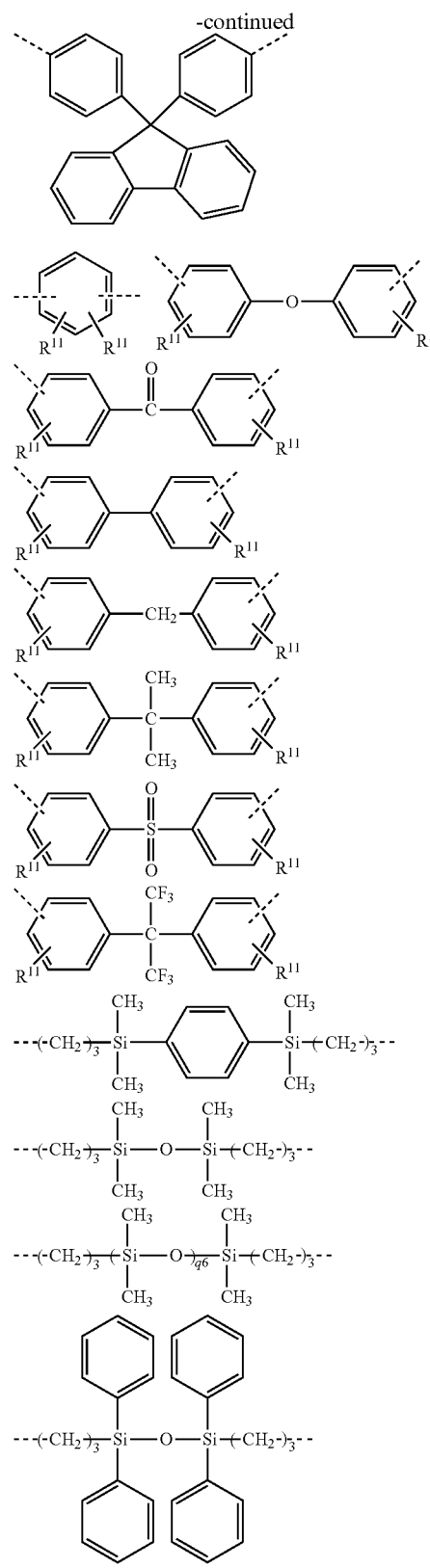
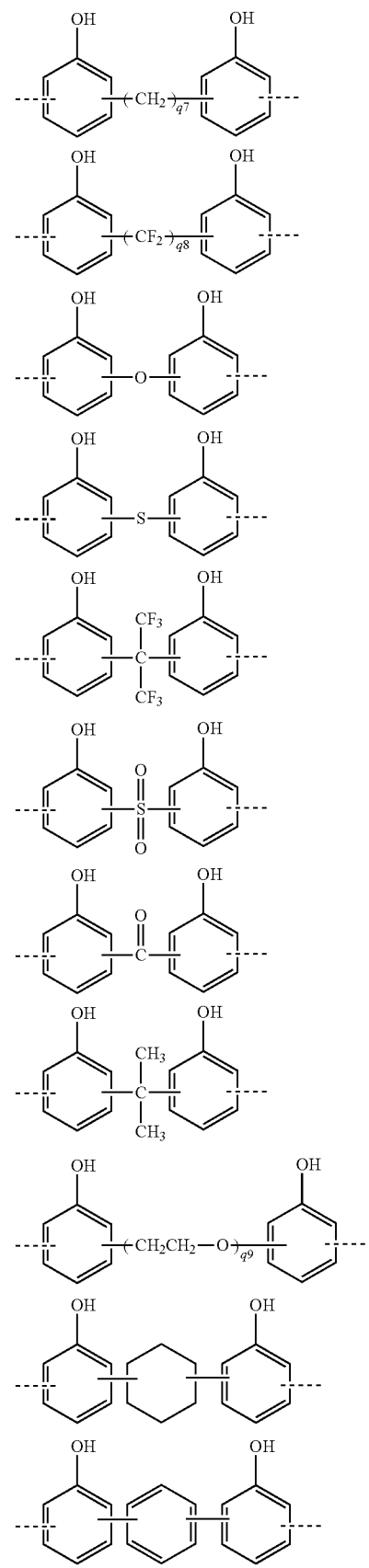
In the formulae, $R^{11}$'s each independently represent a methyl group, an ethyl group, a propyl group, an n-butyl group, or a trifluoromethyl group. "$q_6$" represents a positive number of 2 to 20.

-continued

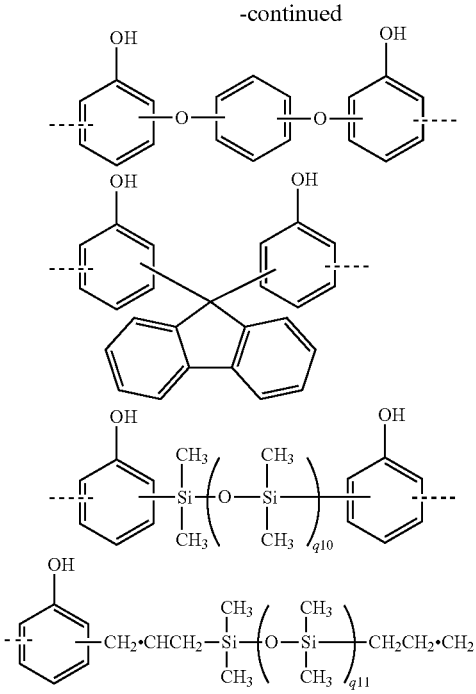

In the formulae, "$q_7$", "$q_8$" and "$q_9$" each represent an integer of 1 to 6. "$q_{10}$" and "$q_{11}$" each represent an integer of 1 to 10.

(Method for Producing Polyimide Resin)

Moreover, the present invention provides a method for producing the above-described polyimide resin of the present invention. To produce the polyimide resin containing the structural unit shown by the general formula (5), first, a tetracarboxylic dianhydride shown by the following general formula (1) is reacted with a diamine shown by the following general formula (9) to obtain a polyamic acid.

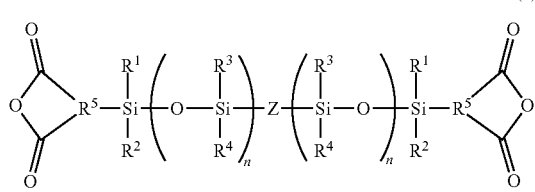

(1)

In the formula, Z, $R^1$ to $R^5$, and "n" are as defined above.

The tetracarboxylic dianhydride shown by the general formula (1) includes compounds shown by the following general formulae (22), but are not limited thereto.

(22)

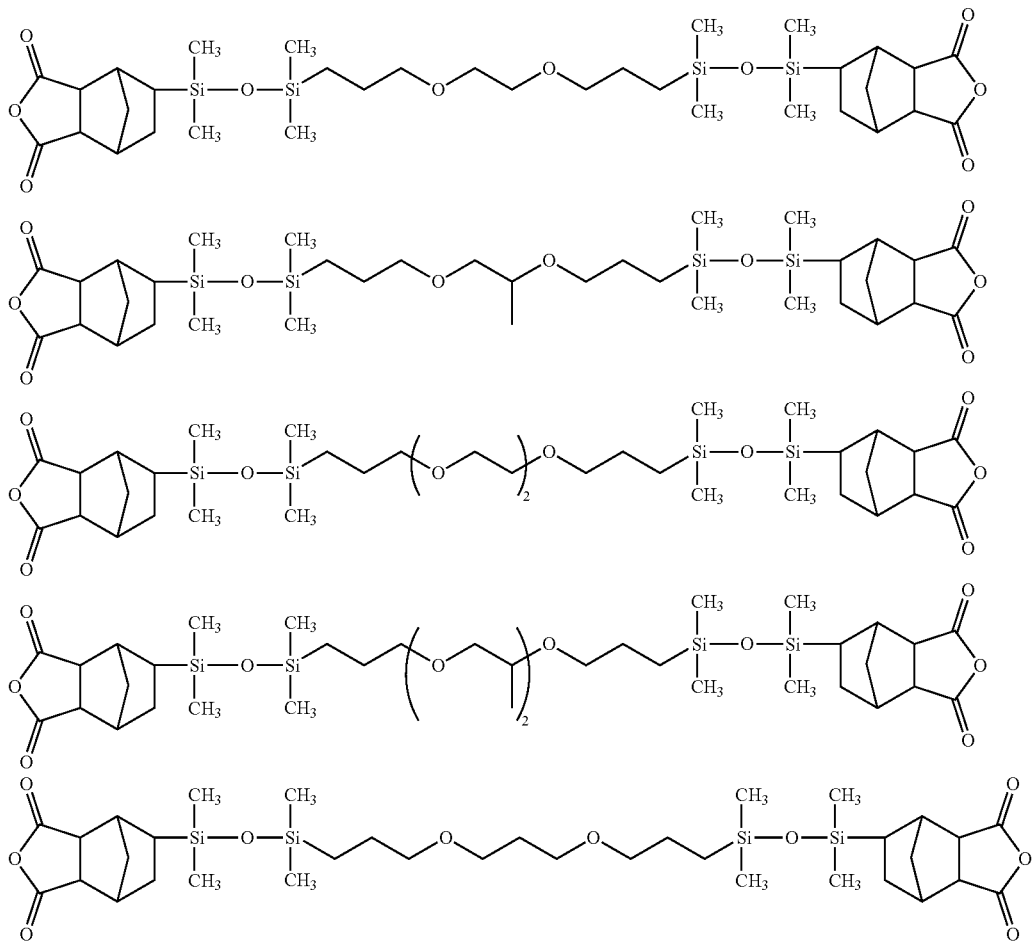

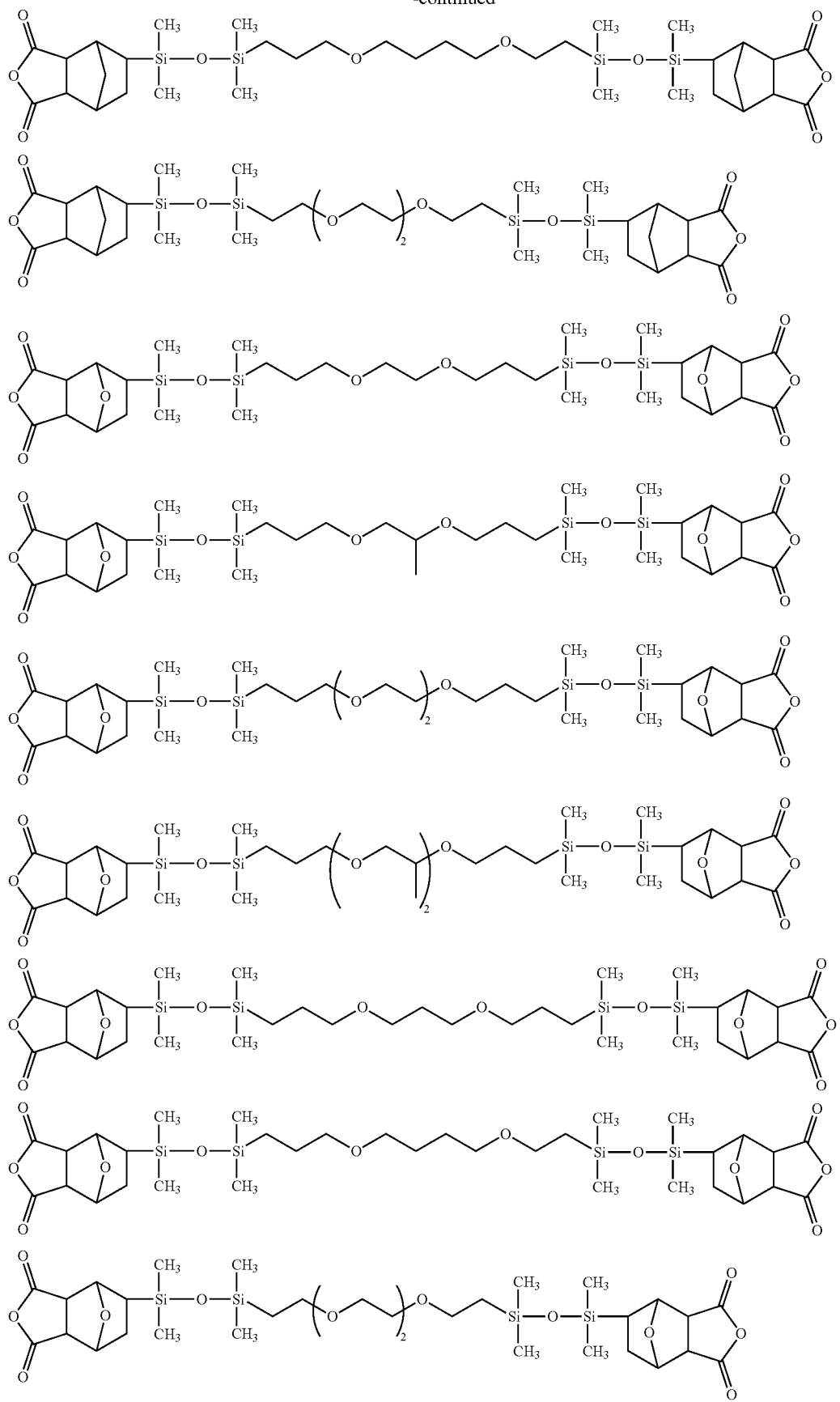

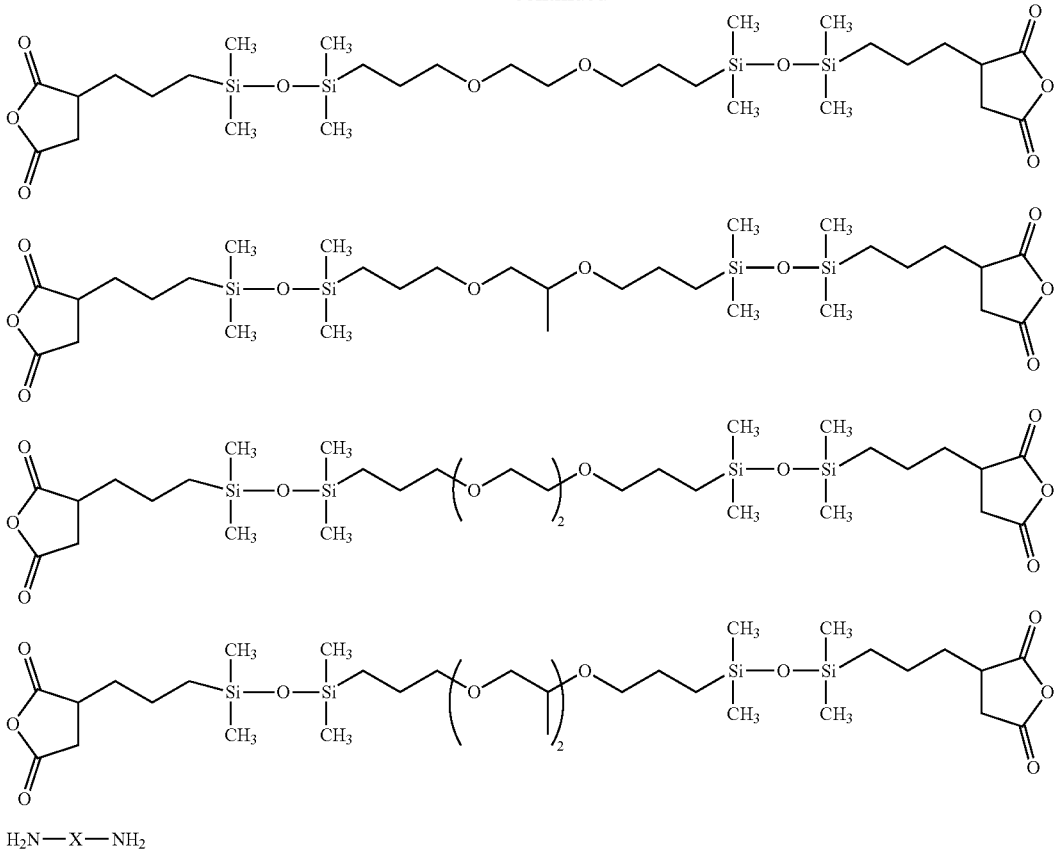

H₂N—X—NH₂ (9)

In the formula, X is as defined above.

The diamine shown by the general formula (9) includes hydroxy group-containing diamines, aromatic diamines, alicyclic diamines, aliphatic diamines, and the like. Examples of preferable hydroxy group-containing diamines include, but are not limited to, 3,3'-diamino-4,4'-dihydroxybiphenyl, 4,4'-diamino-3,3'-dihydroxybiphenyl, bis(3-amino-4-hydroxyphenyl)sulfone, bis(4-amino-3-hydroxyphenyl)sulfone, 2,2-bis(3-amino-4-hydroxyphenyl)hexafluoropropane, 2,2-bis(4-amino-3-hydroxyphenyl)hexafluoropropane, 2,2-bis(3-amino-4-hydroxyphenyl)propane, 2,2-bis(4-amino-3-hydroxyphenyl)propane, and the like.

Examples of the aromatic diamines include, but are not limited to, 3,4'-diaminodiphenyl ether, 4,4'-diaminodiphenyl ether, 3,4'-diaminodiphenylmethane, 4,4'-diaminodiphenylmethane, 3,3'-diaminodiphenylsulfone, 3,4'-diaminodiphenylsulfone, 4,4'-diaminodiphenylsulfone, 3,4'-diaminodiphenylsulfide, 4,4'-diaminodiphenylsulfide, 1,4-bis(4-aminophenoxy)benzene, benzidine, 2,2'-bis(trifluoromethyl)benzidine, 3,3'-bis(trifluoromethyl)benzidine, 2,2'-dimethylbenzidine, 3,3'-dimethylbenzidine, 2,2'3,3'-tetramethylbenzidine, 2,2'-dichlorobenzidine, 3,3'-dichlorobenzidine, 2,2'3,3'-tetrachlorobenzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis[4-(3-aminophenoxy)phenyl]sulfone, bis(4-aminophenoxy)biphenyl, bis{4-(4-aminophenoxy)phenyl}ether, 1,4-bis(4-aminophenoxy)benzene, 9,9-bis(4-aminophenyl)fluorene, 2,2'-bis[3-(3-aminobenzamide)-4-hydroxyphenyl]hexafluoropropane, 4-aminophenyl-4'-aminobenzoate, 4,4'-diaminobenzanilide, diamine compounds in which aromatic rings of the above are substituted by an alkyl group, an alkoxy group, a halogen atom, or the like; and the like.

Examples of the alicyclic diamines include, but are not limited to, cyclobutanediamine, isophoronediamine, bicyclo[2,2,1]heptanebismethylamine, tricyclo[3,3,1,13,7]decane-1,3-diamine, 1,2-cyclohexyldiamine, 1,3-cyclohexyldiamine, 1,4-diaminocyclohexane, trans-1,4-diaminocyclohexane, cis-1,4-diaminocyclohexane, 4,4'-diaminodicyclohexylmethane, 3,3'-dimethyl-4,4'-diaminodicyclohexylmethane, 3,3'-diethyl-4,4'-diaminodicyclohexylmethane, 3,3',5,5'-tetramethyl-4,4'-diaminodicyclohexylmethane, 3,3',5,5'-tetraethyl-4,4'-diaminodicyclohexylmethane, 3,5-diethyl-3',5'-dimethyl-4,4'-diaminodicyclohexylmethane, 4,4'-diaminodicyclohexyl ether, 3,3'-dimethyl-4,4'-diaminodicyclohexyl ether, 3,3'-diethyl-4,4'-diaminodicyclohexyl ether, 3,3',5,5'-tetramethyl-4,4'-diaminodicyclohexyl ether, 3,3',5,5'-tetraethyl-4,4'-diaminodicyclohexyl ether, 3,5-diethyl-3',5'-dimethyl-4,4'-diaminodicyclohexyl ether, 2,2-bis(4-aminocyclohexyl)propane, 2,2-bis(3-methyl-4-aminocyclohexyl)propane, 2,2-bis(3-ethyl-4-aminocyclohexyl)propane, 2,2-bis(3,5-dimethyl-4-aminocyclohexyl)propane, 2,2-bis(3,5-diethyl-4-aminocyclohexyl)propane, 2,2-(3,5-diethyl-3',5'-dimethyl-4,4'-diaminodicyclohexyl)propane, diamine compounds in which aliphatic rings of the above are substituted by an alkyl group, an alkoxy group, a halogen atom, or the like; and the like.

Examples of the aliphatic diamines include, but are not limited to, alkylenediamines such as ethylenediamine, 1,3- diaminopropane, 1,4-diaminobutane, 1,5-diaminopentane, 1,6-diaminohexane, 1,7-diaminoheptane, 1,8-diaminooctane, 1,9-diaminononane, and 1,10-diaminodecane; ethylene glycol diamines such as bis(aminomethyl)ether, bis(2-aminoethyl)ether, and bis(3-aminopropyl)ether; siloxanediamines such as 1,3-bis(3-aminopropyl)tetramethyldisiloxane, 1,3-bis(4-aminobutyl)tetramethyldisiloxane, and α,ω-bis(3-aminopropyl)polydimethylsiloxane; and the like.

These hydroxy group-containing diamines, aromatic diamines, alicyclic diamines, or aliphatic diamines can be used alone or in combination of two or more kinds.

In addition, siloxanediamines can be suitably used.

In the synthesis of the polyamic acid, a ratio of the diamine component shown by the general formula (9) to the acid dianhydride component shown by the general formula (1) is appropriately determined according to the adjustment of the molecular weight of the polyimide, and so forth. The ratio is normally in the range of 0.90 to 1.10, preferably 0.95 to 1.05, more preferably 0.98 to 1.02, in terms of molar ratio.

The reaction between the acid dianhydride component shown by the general formula (1) and the diamine component shown by the general formula (9) is normally performed by mixing the acid dianhydride and the diamine in a solvent at 0 to 80° C., preferably 10 to 50° C.

Specific examples of the solvent include ethers such as tetrahydrofuran and anisole; ketones such as cyclohexanone, 2-butanone, methyl isobutyl ketone, 2-heptanone, 2-octanone, and acetophenone; esters such as butyl acetate, methyl benzoate, and γ-butyrolactone; cellosolves such as butyl cellosolve acetate and propylene glycol monomethyl ether acetate; amides such as N,N-dimethylformamide, N,N-dimethylacetamide, and N-methyl-2-pyrrolidone; and aromatic hydrocarbons such as toluene and xylene. Preferable are ketones, esters, and amides. Particularly preferable are γ-butyrolactone, N,N-dimethylacetamide, and N-methyl-2-pyrrolidone. These solvents may be used alone or in combination of two or more kinds. Normally, the polyimide concentration is adjusted in the range of 10 to 40 mass % in consideration of dissolution viscosity and so forth.

Next, to the resulting reaction solution of the polyamic acid, a non-polar solvent, such as xylene, capable of forming an azeotrope with water is added and heated to 100 to 200° C., preferably 130 to 180° C., and a dehydrative cyclization reaction takes place while water generated from the reaction system is being removed. Thus, the polyimide resin shown by the general formula (5) can be obtained.

In the aforementioned manner, the polyimide resin containing the structural unit (5) may further contain the following structural unit (17).

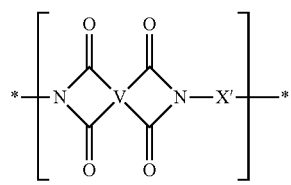

(17)

In the formula, V and X' are as defined above.

The polyimide resin containing the structural unit (17) can be obtained by carrying out the same reaction procedure as the method for producing the structural unit (5). That is, a tetracarboxylic dianhydride shown by the following general formula (23) is reacted with a diamine shown by the following general formula (24) to obtain a polyamic acid.

Then, a dehydrative cyclization reaction takes place, so that the polyimide resin containing the structural unit (17) can be obtained.

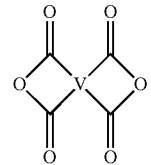

(23)

In the formula, V is as defined above.

Suitable examples of the tetracarboxylic dianhydride shown by the general formula (23) include aromatic acid dianhydrides, alicyclic acid dianhydrides, aliphatic acid dianhydrides, and the like. Examples of the aromatic acid dianhydrides include, but are not limited to, pyromellitic dianhydride, 3,3',4,4'-biphenyltetracarboxylic dianhydride, 2,3,3',4'-biphenyltetracarboxylic dianhydride, 2,3,2',3'-biphenyltetracarboxylic dianhydride, 3,3',4,4'-terphenyltetracarboxylic dianhydride, 3,3',4,4'-oxyphthalic dianhydride, 2,3,3',4'-oxyphthalic dianhydride, 2,3,2',3'-oxyphthalic dianhydride, diphenylsulfone-3,3',4,4'-tetracarboxylic dianhydride, benzophenone-3,3',4,4'-tetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, 1,4-(3,4-dicarboxyphenoxy)benzene dianhydride, p-phenylenebis(trimellitic acid monoester acid anhydride), bis(1,3-dioxo-1,3-dihydroisobenzfuran-5-carboxylic acid)1,4-phenylene, 1,2,5,6-naphthalenetetracarboxylic dianhydride, 2,3,6,7-naphthalenetetracarboxylic dianhydride, 9,9-bis(3,4-dicarboxyphenyl)fluorene dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, 2,2-bis(4-(3,4-dicarboxybenzoyloxy)phenyl)hexafluoropropane dianhydride, 1,6-difluoropyromellitic dianhydride, 1-trifluoromethylpyromellitic dianhydride, 1,6-ditrifluoromethylpyromellitic dianhydride, 2,2'-bis(trifluoromethyl)-4,4'-bis(3,4-dicarboxyphenoxy)biphenyl dianhydride, 2,2'-bis[(dicarboxyphenoxy)phenyl]propane dianhydride, 2,2'-bis[(dicarboxyphenoxy)phenyl]hexafluoropropane dianhydride, acid dianhydride compounds in which aromatic rings of the above are substituted by an alkyl group, an alkoxy group, a halogen atom, or the like; and the like.

Examples of the alicyclic acid dianhydrides include, but are not limited to, 1,2,3,4-cyclobutanetetracarboxylic dianhydride, 1,2,3,4-cyclopentanetetracarboxylic dianhydride, 1,2,4,5-cyclohexanetetracarboxylic dianhydride, 1,2,4,5-cyclopentanetetracarboxylic dianhydride, 1,2,3,4-tetramethyl-1,2,3,4-cyclobutanetetracarboxylic dianhydride, 1,2-dimethyl-1,2,3,4-cyclobutanetetracarboxylic dianhydride, 1,3-dimethyl-1,2,3,4-cyclobutanetetracarboxylic dianhydride, 1,2,3,4-cycloheptanetetracarboxylic dianhydride, 2,3,4,5-tetrahydrofurantetracarboxylic dianhydride, 3,4-dicarboxy-1-cyclohexylsuccinic dianhydride, 2,3,5-tricarboxycyclopentylacetic dianhydride, 3,4-dicarboxy-1,2,3,4-tetrahydro-1-naphthalenesuccinic dianhydride, bicyclo[3,3,0]octane-2,4,6,8-tetracarboxylic dianhydride, bicyclo[4,3,0]nonane-2,4,7,9-tetracarboxylic dianhydride, bicyclo[4,4,0]decane-2,4,7,9-tetracarboxylic dianhydride, bicyclo[4,4,0]decane-2,4,8, 10-tetracarboxylic dianhydride, tricyclo[6,3,0,0<2,6>]undecane-3,5,9,11-tetracarboxylic dianhydride, bicyclo[2,2,2]octane-2,3,5,6-tetracarboxylic dianhydride, bicyclo[2,2,2]oct-7-ene-2,3,5,6-tetracarboxylic dianhydride, bicyclo[2,2,1]heptanetetracarboxylic dianhydride, bicyclo[2,2,1]heptane-5-carboxymethyl-2,3,6-tricarboxylic acid dianhydride, 7-oxabicyclo[2,2,1]heptane-2,4,6,8-tetracarboxylic dianhydride, octahydronaphthalene-1,2,6,7-tetracarboxylic dianhydride, tetradecahydroanthracene-1,2,8,9-tetracarboxylic dianhydride, 3,3',4,4'-dicyclohexanetetracarboxylic dianhydride, 3,3',4,4'-oxydicyclohexanetetracarboxylic dianhydride, 5-(2,5-dioxotetrahydro-3-furanyl)-3-methyl-3-cyclohexene-1,2-dicarboxylic anhydride, "RIKACID" (registered trademark) BT-100 (all tradenames, available from New Japan Chemical Co., Ltd.), derivatives thereof, acid dianhydride compounds in which aliphatic rings of the above are substituted by an alkyl group, an alkoxy group, a halogen atom, or the like; and the like.

Examples of the aliphatic acid dianhydrides include, but are not limited to, 1,2,3,4-butanetetracarboxylic dianhydride, 1,2,3,4-pentanetetracarboxylic dianhydride, derivatives thereof, and the like.

These aromatic acid dianhydrides, alicyclic acid dianhydrides, or aliphatic acid dianhydrides can be used alone or in combination of two or more kinds.

H$_2$N—X'—NH$_2$      (24)

In the formula, X' is as defined above.

Suitable diamines shown by the general formula (24) include the same diamines exemplified as the diamine shown by the general formula (9), but are not limited thereto.

(Molecular Weight of Polymer and Introduction of Terminal Sealing Agent)

A suitable molecular weight of the polyimide resin containing the structural unit (5) or the polyimide resin containing the structural unit (5) and structural unit (17) is preferably 5,000 to 100,000, more preferably 7,000 to 50,000. When the molecular weight is 5,000 or more, a photosensitive resin composition using the polyimide resin as a base resin is easily formed with a desired film thickness on a substrate. When the molecular weight is 100,000 or less, the viscosity of the photosensitive resin composition is not remarkably high, and there is no concern for failing the film formation.

Both terminals of the polyimide resin containing the structural unit (5) or the polyimide resin containing the structural unit (5) and the structural unit (17) may be sealed by a terminal sealing agent for the purposes of controlling the molecular weight in the polycondensation reaction, and suppressing a change in the molecular weight of the obtained polymer over time, that is, gelation. The terminal sealing agent which reacts with the acid dianhydride includes monoamines, monovalent alcohols, and the like. Moreover, the terminal sealing agent which reacts with the diamine compound includes acid anhydrides, monocarboxylic acids, monoacid chloride compounds, monoactive ester compounds, dicarbonate esters, vinyl ethers, and the like. Additionally, the reaction with such terminal sealing agents can introduce various organic groups as terminal groups.

The monoamines used as the sealing agent for the terminal of the acid anhydride group include, but are not limited to, aniline, 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, ameride, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, 4-aminothiophenol, 2-ethynylaniline, 3-ethynylaniline, 4-ethynylaniline, 2,4-diethynylaniline, 2,5-diethynylaniline, 2,6-diethynylaniline, 3,4-diethynylaniline, 3,5-diethynylaniline, 1-ethynyl-2-aminonaphthalene, 1-ethynyl-3-aminonaphthalene, 1-ethynyl-4-aminonaphthalene, 1-ethynyl-5-aminonaphthalene, 1-ethynyl-6-aminonaphthalene, 1-ethynyl-7-aminonaphthalene, 1-ethynyl-8-aminonaphthalene, 2-ethynyl-1-aminonaphthalene, 2-ethynyl-3-aminonaphthalene, 2-ethynyl-4-aminonaphthalene, 2-ethynyl-5-aminonaphthalene, 2-ethynyl-6-aminonaphthalene, 2-ethynyl-7-aminonaphthalene, 2-ethynyl-8-aminonaphthalene, 3,5-diethynyl-1-aminonaphthalene, 3,5-diethynyl-2-aminonaphthalene, 3,6-diethynyl-1-aminonaphthalene, 3,6-diethynyl-2-aminonaphthalene, 3,7-diethynyl-1-aminonaphthalene, 3,7-diethynyl-2-aminonaphthalene, 4,8-diethynyl-1-aminonaphthalene, 4,8-diethynyl-2-aminoaphthalene, and the like. One kind of these may be used alone, or two or more kinds thereof may be used in combination.

Meanwhile, the monovalent alcohols used as the sealing agent for the terminal of the acid anhydride group include, but are not limited to, methanol, ethanol, 1-propanol, 2-propanol, 1-butanol, 2-butanol, 1-pentanol, 2-pentanol, 3-pentanol, 1-hexanol, 2-hexanol, 3-hexanol, 1-heptanol, 2-heptanol, 3-heptanol, 1-octanol, 2-octanol, 3-octanol, 1-nonanol, 2-nonanol, 1-decanol, 2-decanol, 1-undecanol, 2-undecanol, 1-dodecanol, 2-dodecanol, 1-tridecanol, 2-tridecanol, 1-tetradecanol, 2-tetradecanol, 1-pentadecanol, 2-pentadecanol, 1-hexadecanol, 2-hexadecanol, 1-heptadecanol, 2-heptadecanol, 1-octadecanol, 2-octadecanol, 1-nonadecanol, 2-nonadecanol, 1-eicosanol, 2-methyl-1-propanol, 2-methyl-2-propanol, 2-methyl-1-butanol, 3-methyl-1-butanol, 2-methyl-2-butanol, 3-methyl-2-butanol, 2-propyl-1-pentanol, 2-ethyl-1-hexanol, 4-methyl-3-heptanol, 6-methyl-2-heptanol, 2,4,4-trimethyl-1-hexanol, 2,6-dimethyl-4-heptanol, isononylalcohol, 3,7-dimethyl-3- octanol, 2,4-dimethyl-1-heptanol, 2-heptylundecanol, ethylene glycol monoethyl ether, ethylene glycol monomethyl ether, ethylene glycol monobutyl ether, propylene glycol 1-methyl ether, diethylene glycol monoethyl ether, diethylene glycol monomethyl ether, diethylene glycol monobutyl ether cyclopentanol, cyclohexanol, cyclopentane monomethylol, dicyclopentane monomethylol, tricyclodecane monomethylol, norborneol, terpineol, and the like. Moreover, one kind of these may be used alone, or two or more kinds thereof may be used in combination.

The acid anhydrides, monocarboxylic acids, monoacid chloride compounds, and monoactive ester compounds used as the sealing agent for the terminal of the amino group include acid anhydrides such as phthalic anhydride, maleic anhydride, nadic anhydride, cyclohexanedicarboxylic anhydride, and 3-hydroxyphthalic anhydride; monocarboxylic acids such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, 2-ethynylbenzoic acid, 3-ethynylbenzoic acid, 4-ethynylbenzoic acid, 2,4-diethynylbenzoic acid, 2,5-diethynylbenzoic acid, 2,6-diethynylbenzoic acid, 3,4-diethynylbenzoic acid, 3,5-diethynylbenzoic acid, 2-ethynyl-1-naphthoic acid, 3-ethynyl-1-naphthoic acid, 4-ethynyl-1-naphthoic acid, 5-ethynyl-1-naphthoic acid, 6-ethynyl-1-naphthoic acid, 7-ethynyl-1-naphthoic acid, 8-ethynyl-1-naphthoic acid, 2-ethynyl-2-naphthoic acid, 3-ethynyl-2-naphthoic acid, 4-ethynyl-2-naphthoic acid, 5-ethynyl-2-naphthoic acid, 6-ethynyl-2-naphthoic acid, 7-ethynyl-2-naphthoic acid, and 8-ethynyl-2-naphthoic acid; monoacid chloride compounds obtained by acid-chlorinating carboxyl groups of these monocarboxylic acids; monoacid chloride compounds obtained by acid-chlorinating only monocarboxyl groups of dicarboxylic acids such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene, and 2,7-dicarboxynaphthalene; active ester compounds obtained by the reaction between the monoacid chloride compounds and N-hydroxybenzotriazole or N-hydroxy-5-norbornene-2,3-dicarboxyimide; and the like.

The dicarbonate ester compounds used as the sealing agent for the terminal of the amino group include di-tert-butyl dicarbonate, dibenzyl dicarbonate, dimethyl dicarbonate, diethyl dicarbonate, and the like.

The vinyl ether compounds used as the sealing agent for the terminal of the amino group include chloroformic acid esters such as tert-butyl chloroformate, n-butyl chloroformate, isobutyl chloroformate, benzyl chloroformate, allyl chloroformate, ethyl chloroformate, and isopropyl chloroformate; isocyanate compounds such as butyl isocyanate, 1-naphthyl isocyanate, octadecyl isocyanate, and phenyl isocyanate; butyl vinyl ether, cyclohexyl vinyl ether, ethyl vinyl ether, 2-ethylhexyl vinyl ether, isobutyl vinyl ether, isopropyl vinyl ether, n-propyl vinyl ether, tert-butyl vinyl ether, benzyl vinyl ether, and the like.

Other compounds used as the sealing agent for the terminal of the amino group include benzyl chloroformate, benzoyl chloride, fluorenylmethyl chloroformate, 2,2,2-trichloroethyl chloroformate, allyl chloroformate, methanesulfonic acid chloride, p-toluenesulfonic acid chloride, phenyl isocyanate, and the like.

The introduction ratio of the sealing agent for the terminal of the acid anhydride group is in the range of preferably 0.1 to 60 mol %, particularly preferably 5 to 50 mol %, and further preferably 5 to 20 mol %, based on the tetracarboxylic dianhydride components shown by the general formulae (1) and (23), which are starting materials of the polyimide resin of the present invention. Moreover, the introduction ratio of the sealing agent for the terminal of the amino group is in the range of preferably 0.1 to 100 mol %, particularly preferably 5 to 90 mol %, based on the diamine component. Further, a plurality of different terminal groups may be introduced by reacting multiple terminal sealing agents.

The polyimide resin of the present invention may contain a polyimide structural unit other than the structural unit shown by the general formula (5) and the structural unit shown by the general formula (17), a structural unit of the polyimide precursor, a polybenzoxazole structural unit, and/or a structural unit of the polybenzoxazole precursor.

[Photosensitive Resin Composition]

Next, a photosensitive resin composition using the polyimide resin of the present invention as a base resin will be described. In the present invention, a positive type photosensitive resin composition or a negative type photosensitive resin composition can be obtained by using the above-described polyimide resin of the present invention as a base resin.

[Positive Type Photosensitive Resin Composition]

First, in the photosensitive resin composition using the polyimide resin of the present invention as a base resin, a positive type photosensitive resin composition capable of development with an alkali will be described. The positive type photosensitive resin composition of the present invention can be made in, for example, two embodiments explained below, but the invention is not limited thereto.

The first embodiment of the positive type photosensitive resin composition of the present invention comprises:

(A) the polyimide resin comprising the structural unit shown by the general formula (5);

(B) a photosensitive agent which generates an acid by light to increase a dissolution rate in an aqueous alkaline solution and is a compound having a quinonediazide structure; and (D) a solvent.

From the viewpoint of obtaining alkali solubility of the positive type photosensitive resin composition of the present invention, the alkali solubility can be mentioned by the number of moles of a phenolic hydroxyl group in 100 g of the component (A) in which X in the structural unit (5) is a phenol-containing organic group shown by the general formula (6). That is, in 100 g of the component (A), the number of moles of the phenolic hydroxyl group is 0.10 mol or more to 0.40 mol or less, further preferably 0.20 mol or more to 0.35 mol or less, and most preferably 0.25 mol or more to 0.35 mol or less. When the number of moles of the phenolic hydroxyl group is 0.10 mol or more, a desired alkali dissolution rate can be obtained with respect to the developing solution which is an aqueous alkaline solution. Moreover, at the time of the pattern formation, there is no possibility of causing obstruction in the opening of the pattern or observing scum at the bottom portion of the pattern, and the resolution will not be impaired. On the other hand, the amount of the phenolic hydroxyl group that can be introduced per 100 g of the component (A) may be about 0.40 mol in 100 g of the component (A) according to the design of the polyimide resin of the present invention. In this case, the highest solubility in the developing solution of an aqueous alkaline solution can be expected. However, although a cured film is formed by post-curing after patterning using the photosensitive resin composition of the present invention, there is a fear that a large amount of the alkali-soluble phenolic hydroxyl groups remain in this cured film, possibly impairing the resistance of the obtained cured film to alkaline chemicals. Thus, as a preferable amount of the phenolic hydroxyl group introduced, the amount is preferably small enough to give alkali solubility.

The component (B) in the positive type photosensitive resin composition of the present invention is a photosensitive agent which generates an acid by light to increase a dissolution rate in an aqueous alkaline solution and is a compound having a quinonediazide structure. The component (B) includes a compound having a 1,2-naphthoquinonediazide sulfonyl group in the molecule.

The compound having a 1,2-naphthoquinonediazide sulfonyl group in the molecule includes a compound having a 1,2-naphthoquinonediazide sulfonyl group shown by the following general formula (25) or (26) in the molecule.

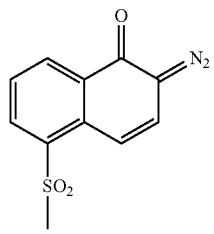

(25)

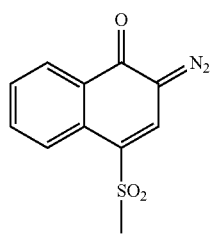

(26)

As the compound into which the 1,2-naphthoquinonediazide sulfonyl group is to be introduced, it is suitable to use specifically trihydroxybenzophenone, tetrahydroxybenzophenone, a ballast molecule having a phenolic hydroxyl group shown by the following general formula (27), or a novolac resin having a repeating unit shown by the following formula (32) and a weight average molecular weight in the range of 2,000 to 20,000, preferably 3,000 to 10,000. That is, the following resin and compound having a phenolic hydroxyl group in each of which a hydrogen atom of the phenolic hydroxyl group has been substituted with the 1,2-naphthoquinonediazide sulfonyl group are suitably used as the component (B).

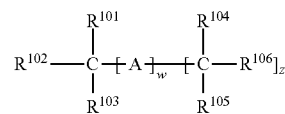

(27)

Here, $R^{101}$ to $R^{106}$ each independently represent a hydrogen atom, a methyl group, a group shown by the following formula (28), or a group shown by the following formula (29). "w" represents an integer of 0 to 2. "z" represents an integer of 0 to 2. When "z" is 0, "w" is 1 or 2. When "z" is 0 and "w" is 1, "A" represents a hydrogen atom, a methyl group, or a group shown by the following formula (28). When "z" is 0 and "w" is 2, one "A" is a methylene group or a group shown by the following formula (30), and the other "A" is a hydrogen atom, a methyl group or a group shown by the following formula (28). When "z" is 1, "A" is a methylene group or a group shown by the following formula (30). When "z" is 2 and "w" is 1, "A" is a methine group or a group shown by the following formula (31). When "z" is 2 and "w" is 2, one "A" is a methylene group or a group shown by the following formula (30), and the other "A" is a methine group or a group shown by the following formula (31).

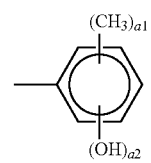

(28)

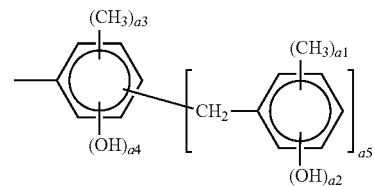

(29)

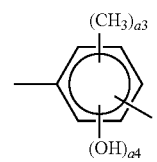

(30)

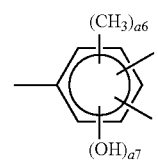

(31)

In the formulae, a1, a2, a3, a4, a5, a6, and a7 each represent an integer of 0 to 3 and satisfy a1+a2≤5, a3+a4≤4, and a6+a7≤3.

In this case, in the low nuclide component (ballast molecule) of the formula (27), the number of the benzene rings is preferably 2 to 20, more preferably 2 to 10, further preferably 3 to 6; meanwhile, a ratio of the number of the phenolic hydroxyl groups and the number of the benzene rings is preferably 0.5 to 2.5, more preferably 0.7 to 2.0, further preferably 0.8 to 1.5.

Such a low nuclide component (ballast molecule) specifically includes the following.
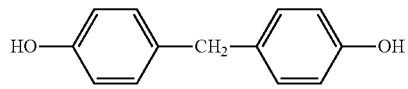 (B-1)
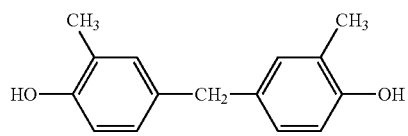 (B-2)
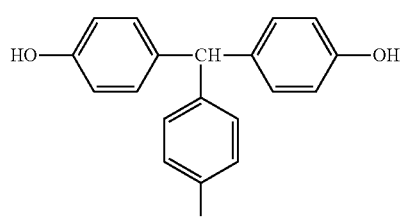 (B-3)
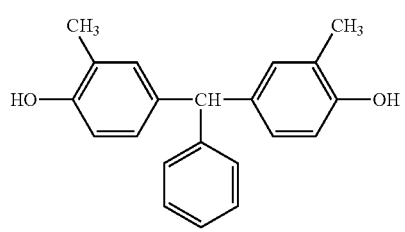 (B-4)
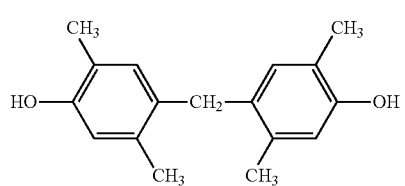 (B-5)
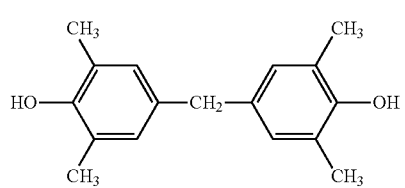 (B-6)
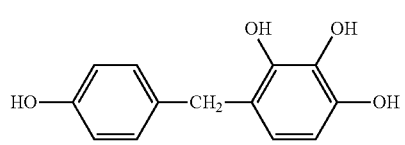 (B-7)
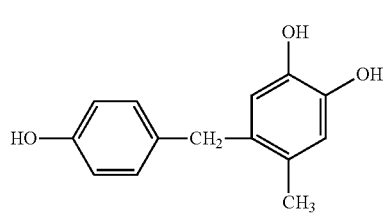 (B-8)
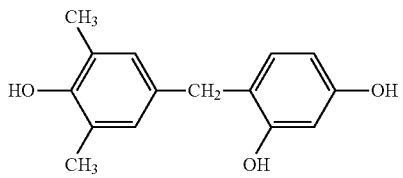 (B-9)
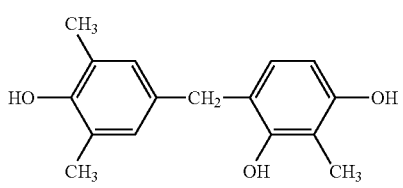 (B-10)
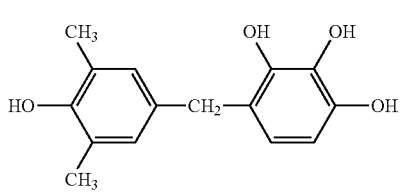 (B-11)
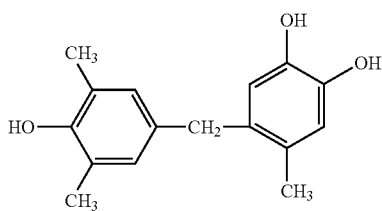 (B-12)
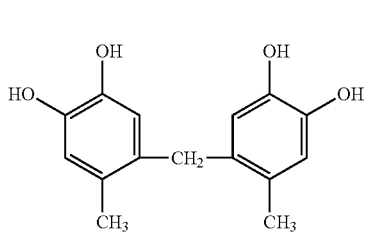 (B-13)
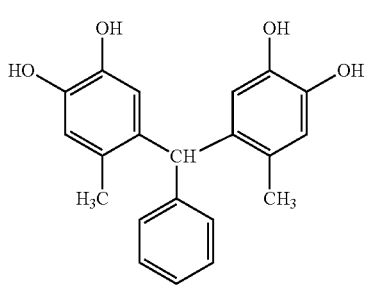 (B-14)
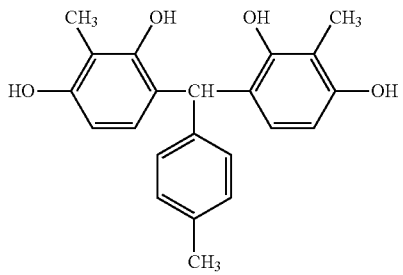 (B-15)

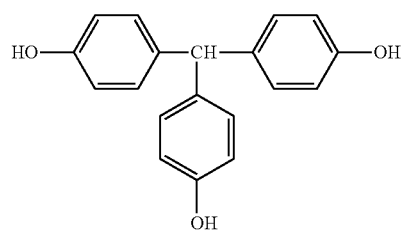
(B-16)
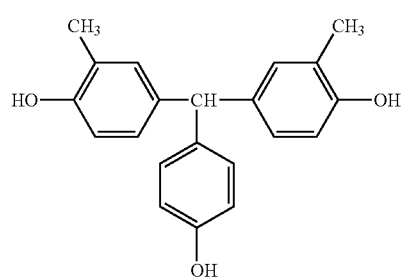
(B-17)
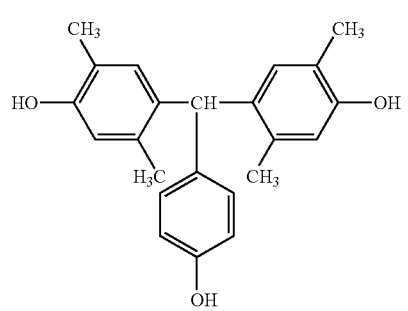
(B-18)
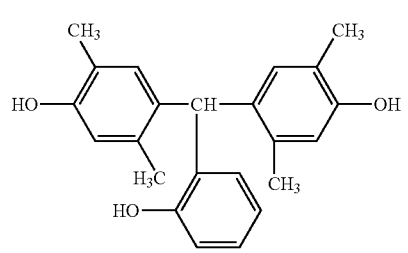
(B-19)
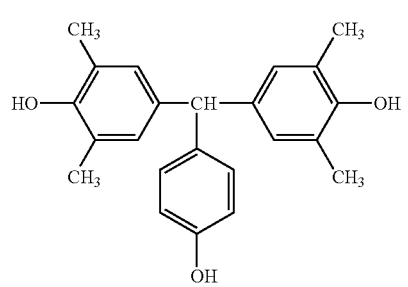
(B-20)
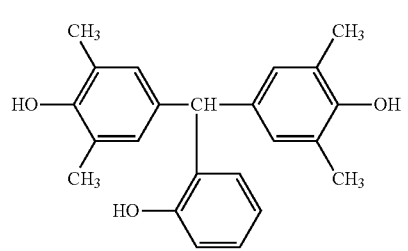
(B-21)
(B-22)
(B-23)
(B-24)
(B-25)
(B-26)
(B-27)

(B-28) 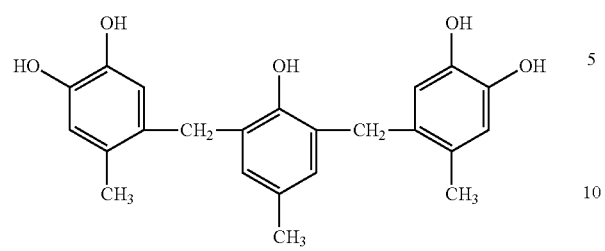
(B-29) 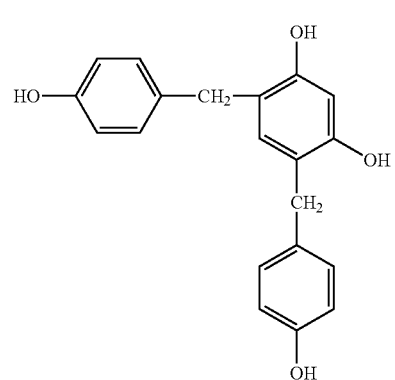
(B-30) 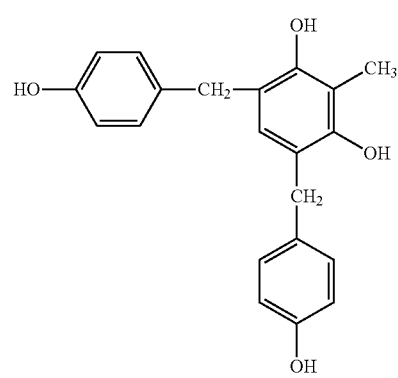
(B-31) 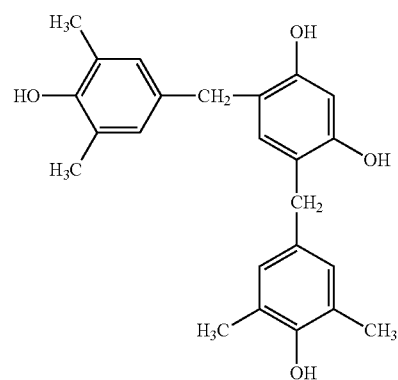
(B-32) 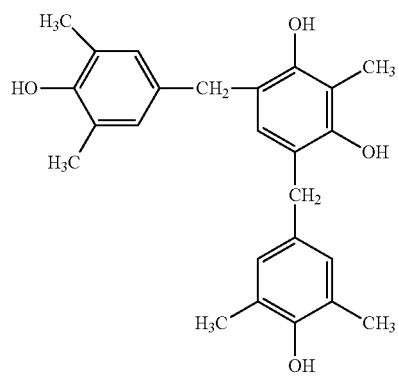
(B-33) 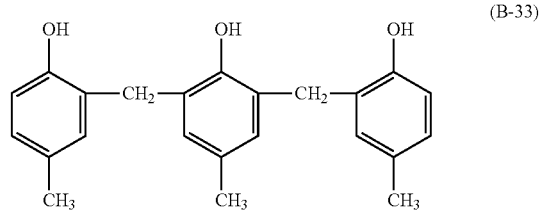
(B-34) 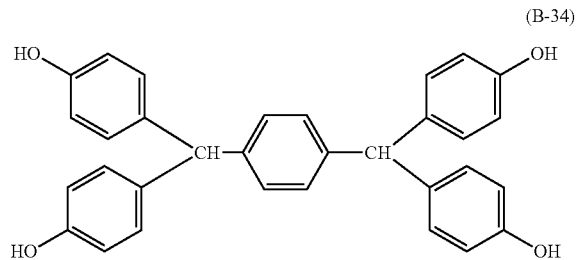
(B-35) 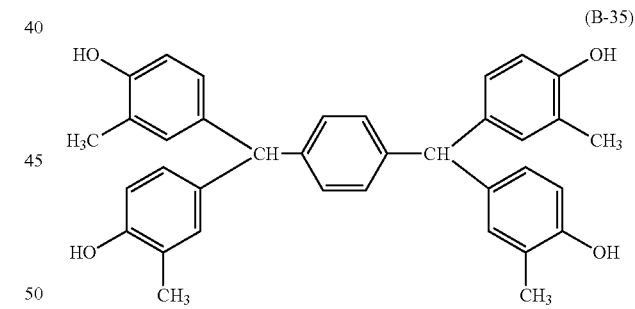
(B-36) 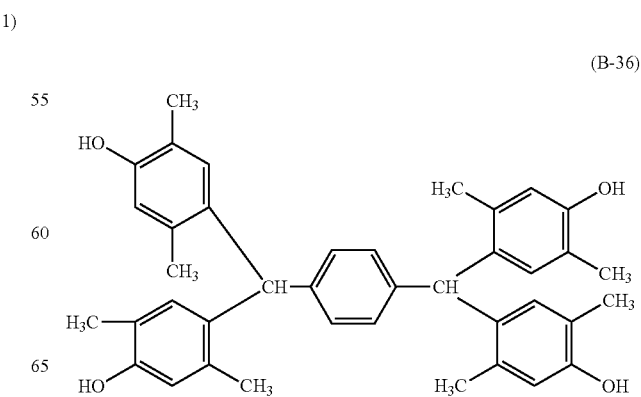

(B-37)
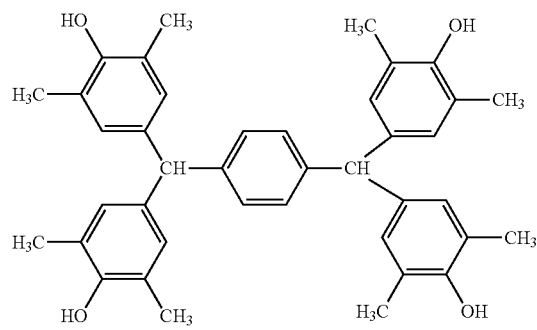

(B-38)
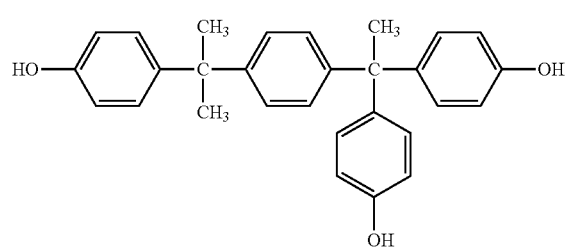

(B-39)
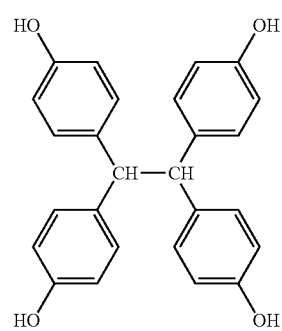

(B-40)
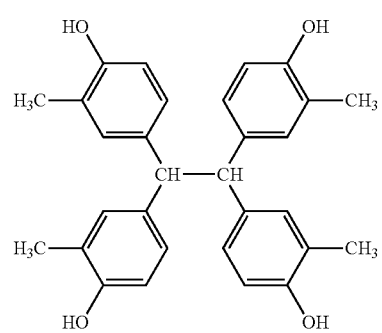

(B-41)
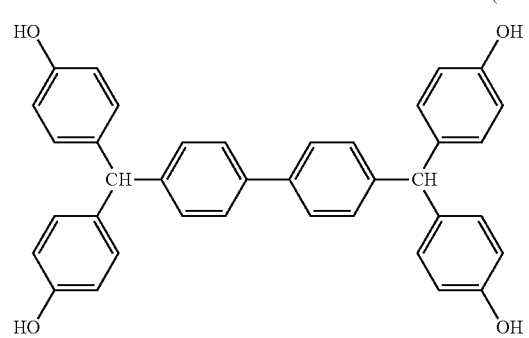

(B-42)
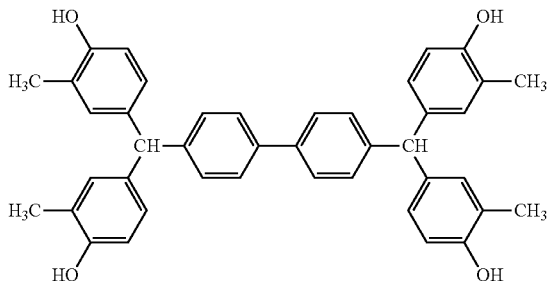

(B-43)
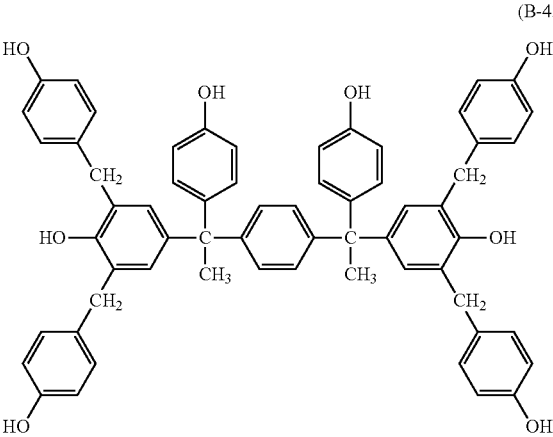

(B-44)
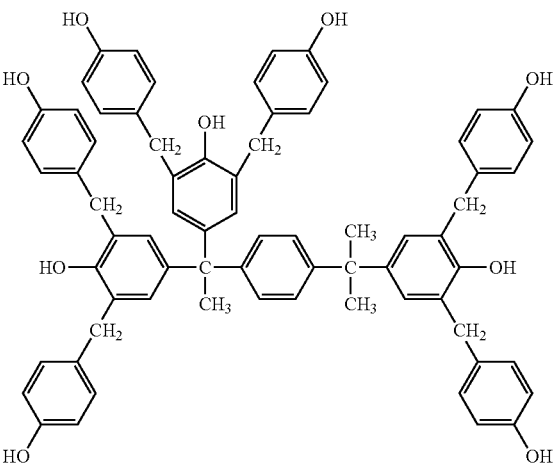

Among the exemplified low nuclide components (ballast molecules), (B-3), (B-29), (B-33), (B-38), and the like are suitably used. Compounds obtained by substituting the hydrogen atom of the phenolic hydroxyl group of these ballast molecules by a 1,2-naphthoquinonediazide sulfonyl group are suitably used for the component (B) in the positive type photosensitive resin composition of the present invention.

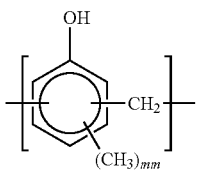

(32)

In the formula, mm represents an integer of 0 to 3.

The novolac resin having a repeating unit shown by the formula (32) can be synthesized by condensing an aldehyde and a phenol shown by the following formula (33), specifically, at least one phenol such as o-cresol, m-cresol, p-cresol, and 3,5-xylenol, by an ordinary method.

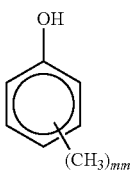

(33)

In the formula, mm represents an integer of 0 to 3.

In this case, examples of the aldehyde include formaldehyde, paraformaldehyde, acetaldehyde, benzaldehyde, and the like. Formaldehyde is suitable.

A ratio of the phenol shown by the formula (33) and the aldehyde is preferably 0.2 to 2, particularly 0.3 to 2, in terms of molar ratio.

In the method for introducing the 1,2-naphthoquinonediazide sulfonyl group into the compound into which the 1,2-naphthoquinonediazide sulfonyl group is to be introduced, it is preferable to utilize a dehydrochlorination condensation reaction of 1,2-naphthoquinonediazide sulfonyl chloride with a phenolic hydroxyl group using a basic catalyst. In the case of the ballast molecule shown by the formula (27), trihydroxybenzophenone, or tetrahydroxybenzophenone, the ratio of substituting the hydrogen atom of the phenolic hydroxyl group with the 1,2-naphthoquinonediazide sulfonyl group is 10 to 100 mol %, preferably 50 to 100 mol %. In the case of the novolac resin shown by the formula (32), the ratio of substituting the hydrogen atom of the phenolic hydroxyl group with the 1,2-naphthoquinonediazide sulfonyl group is 2 to 50 mol %, preferably 3 to 27 mol %.

An amount of the component (B) to be added is preferably 1 to 50 parts by mass, more preferably 10 to 40 parts by mass, based on 100 parts by mass of the component (A). Moreover, the component (B) may be used alone or in combination of two or more kinds thereof.

By formulating such a component (B), the solubility in the aqueous alkaline solution is suppressed by the dissolution inhibiting property of the component (B) and the system becomes alkali insoluble before exposure. At the time of the exposure, the photosensitive agent of the component (B) generates an acid by light whereby the dissolution rate in the aqueous alkaline solution increases, and the system becomes alkali soluble. That is, when an aqueous alkaline solution is used as the developing solution, the unexposed portion is not dissolved in the developing solution, while the exposed portion is soluble in the developing solution, so that it is possible to form a positive type pattern.

Next, the component (D) in the positive type photosensitive resin composition of the first embodiment is a solvent. The solvent of the component (D) is not limited as long as it can dissolve the component (A) and the component (B). Examples of the solvent include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol-mono-tert-butyl ether acetate, and γ-butyrolactone; and the like. One or more of these can be used. Particularly, ethyl lactate, cyclohexanone, cyclopentanone, propylene glycol monomethyl ether acetate, γ-butyrolactone, or a mixed solvent thereof is preferable.

A formulation amount of the component (D) is preferably 50 to 2,000 parts by mass, particularly preferably 100 to 1,000 parts by mass, based on 100 parts by mass of the total formulation amount of the component (A) and the component (B).

Next, the positive type photosensitive resin composition of the second embodiment according to the present invention will be described.

The second embodiment of the positive type photosensitive resin composition of the present invention comprises:

(A) the polyimide resin comprising the structural unit (5);

(B) a photosensitive agent which generates an acid by light to increase a dissolution rate in an aqueous alkaline solution and is a compound having a quinonediazide structure;

(C) at least one of a crosslinking agent(s) selected from an amino condensate modified by formaldehyde or formaldehyde-alcohol, a phenol compound having two or more methylol groups or alkoxymethylol groups in one molecule on average, a compound in which a hydrogen atom of a hydroxyl group of a polyvalent phenol is substituted by a glycidyl group or a group having a glycidyl group, a compound in which a hydrogen atom of a hydroxyl group of a polyvalent phenol is substituted by a substituent shown by the following formula (C-1), and a compound containing two or more groups each shown by the following formula (C-2) or (C-2'),

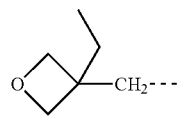

(C-1)

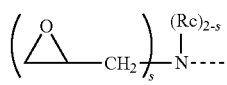

(C-2)

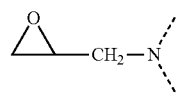

(C-2')

wherein a dotted line represents a bond; Rc represents a linear, branched, or cyclic alkyl group having 1 to 6 carbon atoms; and "s" represents 1 or 2; and (D) a solvent.

As the component (A) and the component (B) in the positive type photosensitive resin composition of the second embodiment according to the present invention, those in the positive type photosensitive resin composition of the first embodiment described above can be suitably used.

The component (C) in the positive type photosensitive resin composition of the second embodiment according to the present invention is at least one of a crosslinking agent(s) selected from an amino condensate modified by formaldehyde or formaldehyde-alcohol, a phenol compound having two or more methylol groups or alkoxymethylol groups in one molecule on average, a compound in which a hydrogen atom of a hydroxyl group of a polyvalent phenol is substituted by a glycidyl group or a group having a glycidyl group, a compound in which a hydrogen atom of a hydroxyl group of a polyvalent phenol is substituted by a substituent shown by the following formula (C-1), and a compound containing two or more groups each shown by the following formula (C-2) or (C-2').

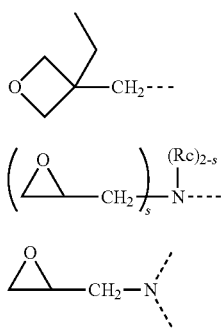

(C-1)

(C-2)

(C-2')

In the formulae, a dotted line represents a bond. Rc represents a linear, branched, or cyclic alkyl group having 1 to 6 carbon atoms. "s" represents 1 or 2.

Examples of the amino condensate modified by the formaldehyde or formaldehyde-alcohol include melamine condensates modified by formaldehyde or formaldehyde-alcohol, and urea condensates modified by formaldehyde or formaldehyde-alcohol.

In the preparation of the melamine condensate modified by the formaldehyde or formaldehyde-alcohol, for example, first, a melamine monomer is modified by formalin to methylolation according to a known method, and the resultant is optionally modified by an alcohol to alkoxylation, so that a modified melamine shown by the following general formula (34) is formed. The alcohol is preferably a lower alcohol, for example, an alcohol having 1 to 4 carbon atoms.

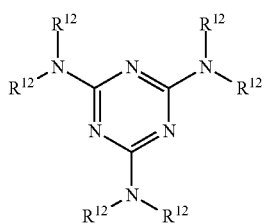

(34)

In the formula, $R^{12}$s may be the same or different from each other, and each represent a methylol group, an alkoxymethyl group containing an alkoxy group having 1 to 4 carbon atoms, or a hydrogen atom. At least one $R^{12}$ is a methylol group or the alkoxymethyl group.

Examples of the $R^{12}$ include alkoxymethyl groups such as a methylol group, a methoxymethyl group, and an ethoxymethyl group; a hydrogen atom; and the like.

The modified melamine shown by the general formula (34) specifically includes trimethoxymethylmonomethylol melamine, dimethoxymethylmonomethylol melamine, trimethylol melamine, hexamethylol melamine, hexamethoxymethylol melamine, and the like.

Then, the modified melamine shown by the general formula (34) or its multimer (for example, an oligomer such as a dimer or a trimer) is subjected to addition condensation polymerization with formaldehyde until the product has a desired molecular weight according to a conventional method. Thus, a melamine condensate modified by formaldehyde or formaldehyde-alcohol is obtained.

Meanwhile, in the preparation of the urea condensate modified by the formaldehyde or formaldehyde-alcohol, for example, a urea condensate having a desired molecular weight is modified by formaldehyde to methylolation according to a known method, and the resultant is optionally modified by an alcohol to alkoxylation. Specific examples of the urea condensate modified by the formaldehyde or formaldehyde-alcohol include methoxymethylated urea condensates, ethoxymethylated urea condensates, propoxymethylated urea condensates, and the like.

These modified melamine condensates and modified urea condensates can be used alone or in mixture of two or more kinds.

Next, examples of the phenol compound having two or more methylol groups or alkoxymethylol groups in one molecule on average include (2-hydroxy-5-methyl)-1,3-benzenedimethanol, 2,2',6,6'-tetramethoxymethylbisphenol A, compounds shown by the following formulae (C-3) to (C-7), and the like.

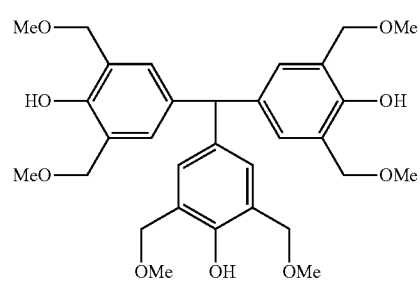

C-3

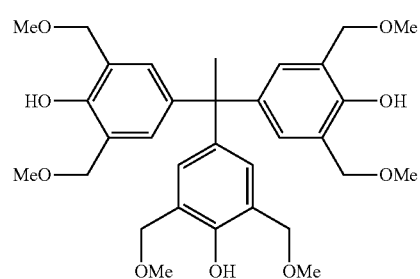

C-4

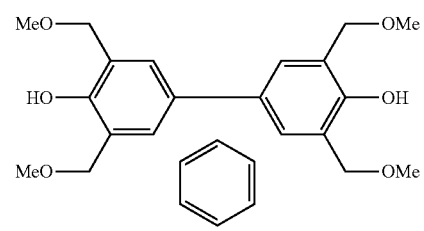
C-5

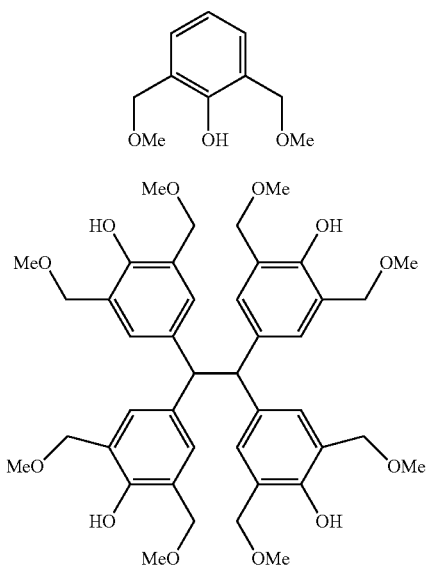
C-6

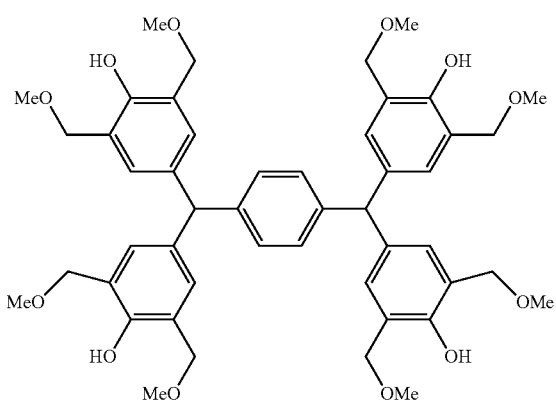
C-7

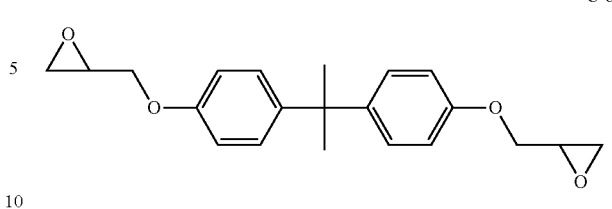
C-8

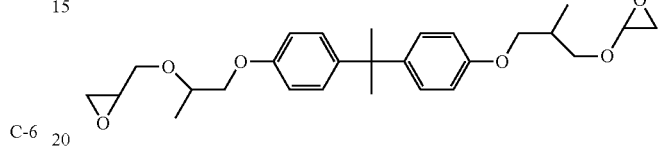
C-9

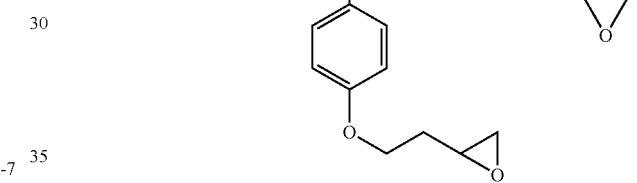
C-10

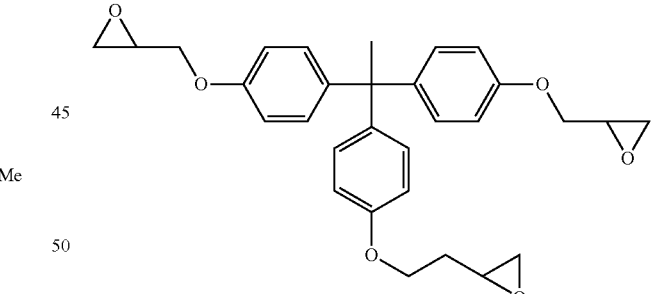
C-11

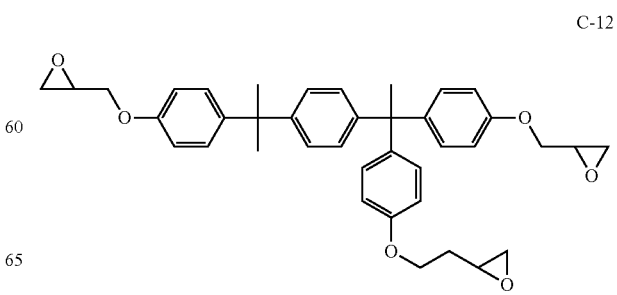
C-12

The crosslinking agents can be used alone or in combination of two or more kinds.

Meanwhile, the compound in which a hydrogen atom of a hydroxyl group of a polyvalent phenol is substituted by a glycidyl group or a group having a glycidyl group includes bisphenol A, tris(4-hydroxyphenyl)methane, and a compound obtained by reacting a hydroxyl group of 1,1,1-tris(4-hydroxyphenyl)ethane with epichlorohydrin in the presence of a base. Suitable examples of the compound in which a hydrogen atom of a hydroxyl group of a polyvalent phenol is substituted by a glycidyl group or a group having a glycidyl group include compounds shown by the following formulae (C-8) to (C-14).

-continued

C-13

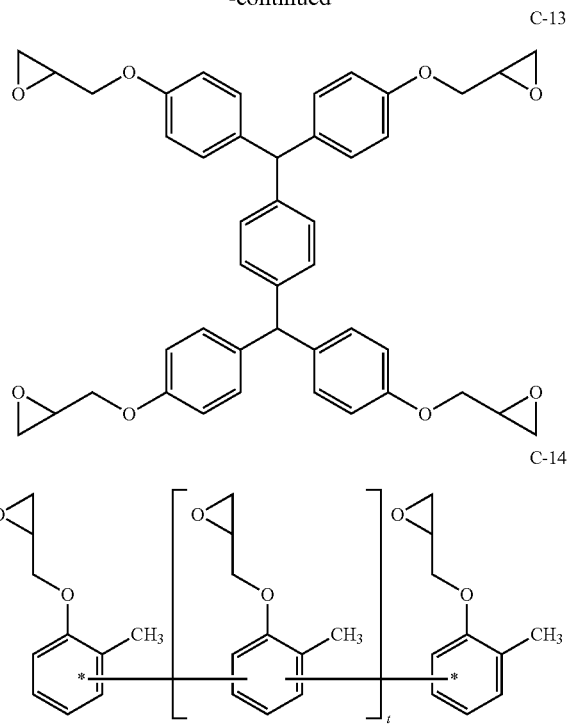

C-14

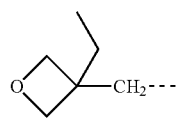

In the formula, "t" satisfies 2≤t≤3.

One or two kinds of these compounds in each of which a hydroxyl group of a polyvalent phenol is substituted by, for example, a glycidoxy group can be used as the crosslinking agent.

The compound in which a hydrogen atom of a hydroxyl group of a polyvalent phenol is substituted by a substituent shown by the following formula (C-1) includes a compound shown by the following formula (C-15) containing two or more of the substituents.

(C-1)

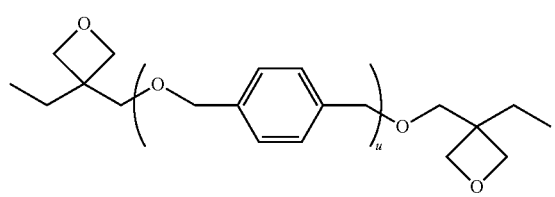

In the formula, the dotted line represents a bond.

(C-15)

In the formula, "u" satisfies 1≤u≤3.

Meanwhile, the compound containing two or more groups (or nitrogen atom having glycidyl groups) shown by the following formula (C-2) includes a compound shown by the following formula (C-16).

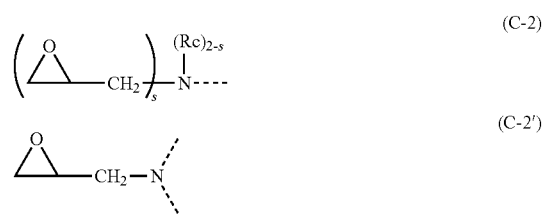
(C-2)
(C-2')

In the formula, a dotted line represents a bond. Rc represents a linear, branched, or cyclic alkyl group having 1 to 6 carbon atoms. "s" represents 1 or 2.

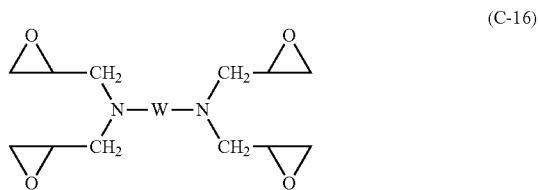
(C-16)

In the formula, W represent a linear, branched, or cyclic alkylene group having 2 to 12 carbon atoms, or a divalent aromatic group.

Examples of the compound shown by the formula (C-16) include compounds shown by the following formulae (C-17) to (C-20).

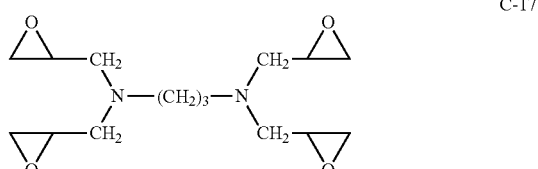
C-17

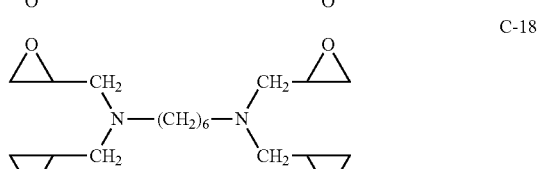
C-18

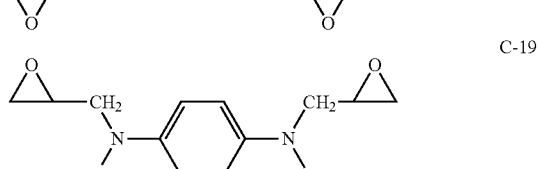
C-19

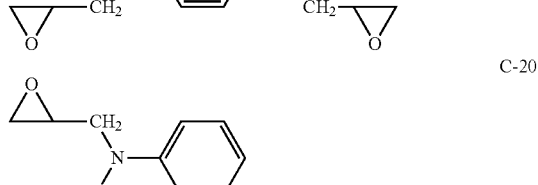
C-20

On the other hand, as the compound containing two or more groups (or nitrogen atom having glycidyl groups) shown by the formula (C-2'), a compound shown by the following formula (C-21) can be suitably used.

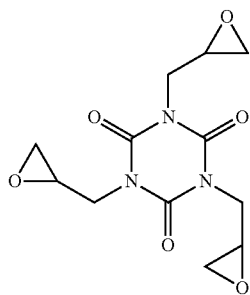

(C-21)

One or two kinds of these compounds containing two or more groups shown by the formula (C-2) or (C-2') can be used as the crosslinking agent.

The component (C) is a component which causes a crosslinking reaction upon post-curing after pattern formation of the positive type photosensitive resin composition using the polymer containing the polyimide precursor of the present invention, and further increases the strength of the cured product. The component (C) has a weight average molecular weight of preferably 150 to 10,000, particularly preferably 200 to 3,000, from the viewpoints of photocurability and heat resistance.

A formulation amount of the component (C) is preferably 0.5 to 50 parts by mass, particularly preferably 1 to 30 parts by mass, based on 100 parts by mass of the component (A) in the positive type photosensitive resin composition of the second embodiment according to the present invention.

Suitable solvents of the component (D) in the positive type photosensitive resin composition of the second embodiment according to the present invention include the same solvents as the solvents described in the first embodiment of the positive type photosensitive resin composition.

Additionally, the positive type photosensitive resin composition of the present invention may further contain a component(s) other than the component (A), the component (B), the component (C), and the component (D). Examples of the other component(s) include an adhesion aid, (E) a surfactant, and the like. As the surfactant (E), for example, compounds exemplified below can be suitably used.

The surfactant (E) is preferably nonionic. Examples thereof include fluorine-based surfactants. Specifically, the examples include perfluoroalkyl polyoxyethylene ethanol, fluorinated alkyl ester, perfluoroalkylamine oxide, fluorine-containing organosiloxane-based compounds, and the like.

As these surfactants, commercially available products can be used. Examples thereof include Fluorad "FC-4430" (available from Sumitomo 3M Limited), Surflon "S-141" and "S-145" (these are available from ASAHI GLASS CO., LTD.), UNIDYNE "DS-401", "DS-4031" and "DS-451" (these are available from DAIKIN INDUSTRIES, LTD.), Megafac "F-8151" (available from DIC Corporation), "X-70-093" (available from Shin-Etsu Chemical Co., Ltd.), and the like. Among these, preferred are Fluorad "FC-4430" (available from Sumitomo 3M Limited) and "X-70-093" (available from Shin-Etsu Chemical Co., Ltd.).

[Negative Type Photosensitive Resin Composition]

Next, in the photosensitive resin composition using the polyimide resin of the present invention as a base resin, a negative type photosensitive resin composition capable of development with an alkali will be described. The negative type photosensitive resin composition of the present invention can be made in, for example, an embodiment explained below, but the invention is not limited thereto.

The embodiment of the negative type photosensitive resin composition of the present invention is a negative type photosensitive resin composition comprising:

(A') the polyimide resin comprising the structural unit (5);
(B') a photoacid generator;
(C') at least one of a crosslinking agent(s) selected from an amino condensate modified by formaldehyde or formaldehyde-alcohol, a phenol compound having two or more methylol groups or alkoxymethylol groups in one molecule on average, a compound in which a hydrogen atom of a hydroxyl group of a polyvalent phenol is substituted by a glycidyl group or a group having a glycidyl group, a compound in which a hydrogen atom of a hydroxyl group of a polyvalent phenol is substituted by a substituent shown by the following formula (C-1), and a compound containing two or more groups each shown by the following formula (C-2) or (C-2'),

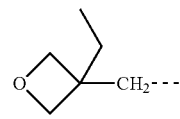

(C-1)

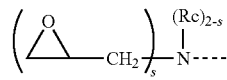

(C-2)

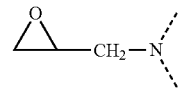

(C-2')

wherein a dotted line represents a bond; Rc represents a linear, branched, or cyclic alkyl group having 1 to 6 carbon atoms; and "s" represents 1 or 2; and (D) a solvent.

The component (A') of the negative type photosensitive resin composition in the present invention is the polyimide resin containing the structural unit (5), and the same resin as that in the above-described positive type photosensitive resin composition can be suitably used.

In the negative type photosensitive resin composition of the present invention, a crosslinking group of the component (C') is crosslinked with the polymer of the component (A') by using an acid generated from the component (B') as a catalyst whereby a negative type photosensitive resin composition can be formed.

The component (B') of the negative type photosensitive resin composition in the present invention is a photoacid generator. The photoacid generator used is a material which generates an acid by irradiation with light having a wavelength of 190 to 500 nm, the acid serving as a curing catalyst. Examples of the photoacid generator include onium salts, diazomethane derivatives, glyoxime derivatives, β-ketosulfone derivatives, disulfone derivatives, nitrobenzyl sulfonate derivatives, sulfonic acid ester derivatives, imidyl-sulfonate derivatives, oxime sulfonate derivatives, iminosulfonate derivatives, triazine derivatives, and the like.

An example of the onium salts includes a compound shown by the following general formula (35).

$$(R^{13})_j M^+ K^- \qquad (35)$$

In the formula, $R^{13}$ represents a linear, branched, or cyclic alkyl group having 1 to 12 carbon atoms, an aryl group having 6 to 12 carbon atoms, or an aralkyl group having 7 to 12 carbon atoms each of which may have a substituent(s). $M^+$ represents an iodonium cation or a sulfonium cation. $K^-$ represents a non-nucleophilic counter ion. "j" represents 2 or 3.

As the $R^{13}$, examples of the alkyl group include a methyl group, an ethyl group, a propyl group, a butyl group, a cyclohexyl group, a 2-oxocyclohexyl group, a norbornyl group, an adamantyl group, and the like. Examples of the aryl group include a phenyl group; alkoxyphenyl groups such as an o-, m- or p-methoxyphenyl group, an ethoxyphenyl group, and a m- or p-tert-butoxyphenyl group; alkylphenyl groups such as a 2-, 3- or 4-methylphenyl group, an ethylphenyl group, a 4-tert-butylphenyl group, a 4-butylphenyl group, and a dimethylphenyl group; and the like. Examples of the aralkyl group include groups such as a benzyl group and a phenethyl group.

The non-nucleophilic counter ion of $K^-$ includes halide ions such as a chloride ion and a bromide ion; fluoroalkyl sulfonates such as triflate, 1,1,1-trifluoroethanesulfonate, and nonafluorobutanesulfonate; arylsulfonates such as tosylate, benzenesulfonate, 4-fluorobenzenesulfonate, and 1,2,3,4,5-pentafluorobenzenesulfonate; alkylsulfonates such as mesylate and butanesulfonate; and the like.

The diazomethane derivative includes a compound shown by the following general formula (36).

$$R^{14}-SO_2-\overset{\overset{N_2}{\|}}{C}-SO_2-R^{14} \qquad (36)$$

In the formula, $R^{14}$s may be the same or different from each other, and each represent a linear, branched, or cyclic alkyl group or halogenated alkyl group having 1 to 12 carbon atoms, an aryl group or halogenated aryl group having 6 to 12 carbon atoms, or an aralkyl group having 7 to 12 carbon atoms.

As the $R^{14}$, examples of the alkyl group include a methyl group, an ethyl group, a propyl group, a butyl group, an amyl group, a cyclopentyl group, a cyclohexyl group, a norbornyl group, an adamantyl group, and the like. Examples of the halogenated alkyl group include a trifluoromethyl group, a 1,1,1-trifluoroethyl group, a 1,1,1-trichloroethyl group, a nonafluorobutyl group, and the like. Examples of the aryl group include a phenyl group; alkoxyphenyl groups such as an o-, m- or p-methoxyphenyl group, an ethoxyphenyl group, and a m- or p-tert-butoxyphenyl group; alkylphenyl groups such as a 2-, 3- or 4-methylphenyl group, an ethylphenyl group, a 4-tert-butylphenyl group, a 4-butylphenyl group, and a dimethylphenyl group; and the like. Examples of the halogenated aryl group include a fluorophenyl group, a chlorophenyl group, a 1,2,3,4,5-pentafluorophenyl group, and the like. Examples of the aralkyl group include a benzyl group, a phenethyl group, and the like.

The photoacid generator specifically includes onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, and diphenyl(4-thiophenoxyphenyl)sulfonium hexafluoroantimonate; diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane; glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime; oxime sulfonate derivatives such as α-(benzenesulfoniumoxyimino)-4-methylphenylacetonitrile; β-ketosulfone derivatives such as 2-cyclohexylcarbonyl-2-(p-toluenesulfonyl)propane and 2-isopropylcarbonyl-2-(p-toluenesulfonyl)propane; disulfone derivatives such as diphenyldisulfone and dicyclohexyldisulfone; nitrobenzyl sulfonate derivatives such as 2,6-dinitrobenzyl p-toluenesulfonate and 2,4-dinitrobenzyl p-toluenesulfonate; sulfonic acid ester derivatives such as 1,2,3-tris(methanesulfonyloxy)benzene, 1,2,3-tris(trifluoromethanesulfonyloxy)benzene, and 1,2,3-tris(p- toluenesulfonyloxy)benzene; imid-yl-sulfonate derivatives such as phthalimid-yl-triflate, phthalimid-yl-tosylate, 5-norbornene-2,3-dicarboxyimid-yl-triflate, 5-norbornene-2,3-dicarboxyimid-yl-tosylate, 5-norbornene-2,3-dicarboxyimid-yl-n-butylsulfonate, and n-trifluoromethylsulfonyloxynaphthylimide; iminosulfonates such as (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)-acetonitrile; 2-methyl-2[(4-methylphenyl)sulfonyl]-1-[(4-methylthio)phenyl]-1-propane, and the like. Among these, imid-yl-sulfonates, iminosulfonates, oxime sulfonates, and the like are suitably used. These photoacid generators can be used alone or in combination of two or more kinds.

A formulation amount of the photoacid generator of the component (B') is preferably 0.05 to 20 parts by mass, particularly preferably 0.2 to 5 parts by mass, based on 100 parts by mass of the component (A') in the negative type photosensitive resin composition of the present invention from the viewpoint of light absorption of the photoacid generator itself and photocurability in the thick film.

As the component (C') in the negative type photosensitive resin composition of the present invention, the same cross-linking agent as the component (C) described in the second embodiment of the positive type photosensitive resin composition can be preferably used.

The component (C') in the negative type photosensitive resin composition of the present invention is a component which can form a negative type pattern as a result of crosslinking between a crosslinking group of the component (C') and the polymer of the component (A') with a catalyst of an acid generated from the component (B') as described above. Besides, the component (C') further increases the strength of the cured product by causing a crosslinking reaction in the post-curing after the pattern formation. The component (C') has a weight average molecular weight of preferably 150 to 10,000, particularly preferably 200 to 3,000, from the viewpoints of photocurability and heat resistance.

A formulation amount of the component (C') is preferably 0.5 to 50 parts by mass, particularly preferably 1 to 30 parts by mass, based on 100 parts by mass of the component (A') in the negative type photosensitive resin composition of the present invention.

The component (D) in the negative type photosensitive resin composition of the present invention is a solvent. The solvent of the component (D) is not limited as long as it can dissolve the component (A'), the component (B'), and the component (C'). The component (D) includes the same solvents as exemplified in the first embodiment or the second embodiment of the positive type photosensitive resin composition.

The negative type photosensitive resin composition of the present invention also may further contain other components than the component (A'), the component (B'), the component (C'), and the component (D). Examples of the other components include (F) a sensitizer, an adhesion aid, a polymerization inhibitor for heightening storage stability, (E) a surfactant conventionally used for improving coating property, and the like. As the surfactant (E), the same surfactants as described in the positive type photosensitive resin composition can be preferably used.

Examples of the sensitizer (F) include 7-N,N-diethylaminocoumarin, 7-diethylamino-3-thenoylcoumarin, 3,3'-carbonylbis(7-N,N-diethylamino)coumarin, 3,3'-carbonylbis(7-N,N-dimethoxy) coumarin, 3-thienylcarbonyl-7-N,N-diethylaminocoumarin, 3-benzoylcoumarin, 3-benzoyl-7-N,N-methoxycoumarin, 3-(4'-methoxybenzoyl)coumarin, 3,3'-carbonylbis-5,7-(dimethoxy)coumarin, benzalacetophenone, 4'-N,N-dimethylaminobenzalacetophenone, 4'-acetaminobenzal-4-methoxyacetophenone, dimethylaminobenzophenone, diethylaminobenzophenone, 4,4'-bis(N-ethyl, N-methyl)benzophenone, and the like. A content thereof is preferably 0.05 to 20 parts by mass, more preferably 0.1 to 10 parts by mass, based on 100 parts by mass of the polymer of the polyimide precursor of the present invention.

Additionally, to the negative type photosensitive resin composition of the present invention, a basic compound may be added as a component (G), if necessary. The basic compound is suitably a compound capable of suppressing the diffusion rate when an acid generated by the photoacid generator diffuses in the resist film. Moreover, formulating the basic compound improves the resolution, suppresses a change in sensitivity after exposure, reduces the substrate dependency and environment dependency, and can improve the exposure margin, pattern shape, and so forth.

The basic compound includes primary, secondary, and tertiary aliphatic amines, hybrid amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives, imide derivatives, a compound shown by the following general formula (37), and the like.

$$N(\alpha)_p(\beta)_{3-p} \qquad (37)$$

In the formula, "p" is 1, 2, or 3. The side chains α may be the same or different from each other, and can be any of substituents shown by the following general formulae (38) to (40). The side chains β may be the same or different from each other, and each represent a hydrogen atom or a linear, branched or cyclic alkyl group having 1 to 20 carbon atoms, which may contain an ether bond or a hydroxyl group. In addition, the side chains α may bond to each other to form a ring.

$$*\!-\!\!\!-\![R^{300}\!-\!\!O\!-\!\!R^{301}] \qquad (38)$$

$$*\!-\!\!\!-\!\!\left[R^{302}\!-\!\!O\!-\!\!R^{303}\!-\!\!\overset{O}{\underset{\|}{C}}\!-\!\!R^{304}\right] \qquad (39)$$

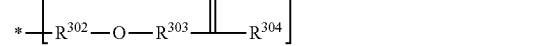

$$*\!-\!\!\!-\!\!\left[R^{305}\!-\!\!\overset{O}{\underset{\|}{C}}\!-\!\!O\!-\!\!R^{306}\right] \qquad (40)$$

Here, $R^{300}$, $R^{302}$, and $R^{305}$ each represent a linear or branched alkylene group having 1 to 4 carbon atoms. $R^{301}$ and $R^{304}$ each represent a hydrogen atom or a linear, branched or cyclic alkyl group having 1 to 20 carbon atoms, which may contain one or more hydroxyl groups, ether bonds, ester bonds, and/or lactone rings. $R^{303}$ represents a single bond or a linear or branched alkylene group having 1 to 4 carbon atoms. $R^{306}$ represents a linear, branched or cyclic alkyl group having 1 to 20 carbon atoms, which may contain one or more hydroxyl groups, ether bonds, ester bonds, and/or lactone rings. In addition, * represents a bonding terminal.

Examples of the primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, and the like.

Examples of the secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine, and the like.

Examples of the tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, N,N,N',N'-tetramethyltetraethylenepentamine, and the like.

Examples of the hybrid amines include dimethylethylamine, methylethylpropylamine, benzylamine, phenethylamine, benzyldimethylamine, and the like.

Examples of the aromatic amines and heterocyclic amines include aniline derivatives (for example, aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, and the like), diphenyl(p-tolyl)amine, methyldiphenylamine, triphenylamine, phenylenediamine, naphthylamine, diaminonaphthalene, pyrrole derivatives (for example, pyrrole, 2H-pyrrole, 1-methylpyrrole, 2,4-dimethylpyrrole, 2,5-dimethylpyrrole, N-methylpyrrole, and the like), oxazole derivatives (for example, oxazole, isoxazole, and the like), thiazole derivatives (for example, thiazole, isothiazole, and the like), imidazole derivatives (for example, imidazole, 4-methylimidazole, 4-methyl-2-phenylimidazole, and the like), pyrazole derivatives, furazan derivatives, pyrroline derivatives (for example, pyrroline, 2-methyl-1-pyrroline, and the like), pyrrolidine derivatives (for example, pyrrolidine, N-methylpyrrolidine, pyrrolidinone, N-methylpyrrolidone, and the like), imidazoline derivatives, imidazolidine derivatives, pyridine derivatives (for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, dimethylaminopyridine, and the like), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (for example, quinoline, 3-quinolinecarbonitrile, and the like), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, uridine derivatives, and the like.

Examples of the nitrogen-containing compounds having a carboxyl group include aminobenzoic acid, indolecarboxylic acid, amino acid derivatives (for example, nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, methoxyalanine, and the like), and the like.

Examples of the nitrogen-containing compounds having a sulfonyl group include 3-pyridine sulfonic acid, pyridinium p-toluenesulfonate, and the like.

Examples of the nitrogen-containing compounds having a hydroxyl group, the nitrogen-containing compounds having a hydroxyphenyl group, and the alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide, N-(2-hydroxyethyl)isonicotinamide, and the like.

Examples of the amide derivatives include formamide, N-methylformamide, N,N-dimethylformamide, acetamide, N-methylacetamide, N,N-dimethylacetamide, propionamide, benzamide, and the like. Examples of the imide derivatives include phthalimide, succinimide, maleimide, and the like.

Examples of the compound shown by the general formula (37) include, but are not limited to, tris[2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine; N,N-bis(2-acetoxyethyl)2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)2-(methoxycarbonyl)ethylamine, N,N-bis(2-acetoxyethyl)2-(methoxycarbonyl)ethylamine, N,N-bis(2-hydroxyethyl)2-(ethoxycarbonyl)ethylamine, N,N-bis(2-acetoxyethyl)2-(ethoxycarbonyl)ethylamine, N,N-bis(2-hydroxyethyl)2-(2-methoxyethoxycarbonyl)ethylamine, N,N-bis(2-acetoxyethyl)2-(2-methoxyethoxycarbonyl)ethylamine, N,N-bis(2-hydroxyethyl)2-(2-hydroxyethoxycarbonyl)ethylamine, N,N-bis(2-acetoxyethyl)2-(2-acetoxyethoxycarbonyl)ethylamine, N,N-bis(2-hydroxyethyl)2-[(methoxycarbonyl)methoxycarbonyl]ethylamine, N,N-bis(2-acetoxyethyl)2-[(methoxycarbonyl)methoxycarbonyl] ethylamine, N,N-bis(2-hydroxyethyl)2-(2-oxopropoxycarbonyl)ethylamine, N,N-bis(2-acetoxyethyl) 2-(2-oxopropoxycarbonyl)ethylamine, N,N-bis(2-hydroxyethyl)2-(tetrahydrofurfuryloxycarbonyl) ethylamine, N,N-bis(2-acetoxyethyl)2-(tetrahydrofurfuryloxycarbonyl)ethylamine, N,N-bis(2-hydroxyethyl)2-[(2-oxotetrahydrofuran-3-yl)oxycarbonyl] ethylamine, N,N-bis(2-acetoxyethyl)2-[(2-oxotetrahydrofuran-3-yl)oxycarbonyl]ethylamine, N,N-bis (2-hydroxyethyl)2-(4-hydroxybutoxycarbonyl)ethylamine, N,N-bis(2-formyloxyethyl)2-(4-formyloxybutoxycarbonyl) ethylamine, N,N-bis(2-formyloxyethyl)2-(2-formyloxyethoxycarbonyl)ethylamine, N,N-bis(2-methoxyethyl)2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl) bis[2-(methoxycarbonyl)ethyl]amine, N-(2-methoxyethyl) bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis (methoxycarbonylmethyl)amine, N-hexylbis (methoxycarbonylmethyl)amine, and β-(diethylamino)-δ-valerolactone. These basic compounds can be used alone or in combination of two or more kinds.

A formulation amount of the basic compound is preferably 0 to 3 parts by mass, particularly preferably 0.01 to 1 parts by mass, based on 100 parts by mass of the component (A') in the negative type photosensitive resin composition of the present invention from the viewpoint of sensitivity.

(Patterning Process)

Next, a patterning process using the positive type photosensitive resin composition and the negative type photosensitive resin composition of the present invention will be described.

For forming a pattern in either case of the positive type photosensitive resin composition and the negative type photosensitive resin composition of the present invention, a known lithography technique can be employed. For example, a photosensitive resin composition is coated by means of spin coating (spin coating method) onto a silicon wafer, a $SiO_2$ substrate, a SiN substrate, or a substrate where a pattern such as copper wiring has been formed. Then, the resultant is prebaked under conditions of 80 to 130° C. for 50 to 600 seconds or so to form a film of a photosensitive material with a thickness of 1 to 50 µm, preferably 1 to 30 µm, further preferably 5 to 20 µm.

In the spin coating method, after the photosensitive resin composition is dispensed onto the silicon substrate by about 5 mL, the substrate is rotated, so that the photosensitive resin composition can be coated onto the substrate. In this event, by adjusting the rotation speed, the film thickness of the film of the photosensitive material on the substrate can be easily adjusted.

Next, a mask for forming an intended pattern is placed over the film of the photosensitive material, and irradiated with a high energy beam such as i line or g line having a wavelength of 190 to 500 nm or an electron beam at an exposure dose of about 1 to 5,000 $mJ/cm^2$, preferably about 100 to 2,000 $mJ/cm^2$.

Next, as necessary, a heat treatment after the exposure (post exposure bake (PEB)) may be carried out on a hot plate at 60 to 150° C. for 1 to 10 minutes, preferably at 80 to 120° C. for 1 to 5 minutes.

Thereafter, development is carried out. For all the compositions of the positive type photosensitive resin compositions of the first embodiment and the second embodiment as well as the negative type photosensitive resin composition of the present invention, development by an alkali using an aqueous alkaline solution is possible.

Meanwhile, an aqueous alkaline solution suitably usable in the development by an alkali is a 2.38% aqueous tetramethylhydroxy ammonium (TMAH) solution. The development can be carried out, for example, by an ordinary method such as a spray method or a paddle method, or by dipping the substrate in a developing solution. Thereafter, if necessary, cleaning, rinsing, drying, and so forth may be performed to obtain a resist film having a desired pattern.

Further, the patterned film obtained by this patterning process is heated and post-cured at a temperature of 100 to 300° C., preferably 150 to 300° C., further preferably 180 to 250° C., by using an oven or a hot plate whereby a cured film can be formed. The post-curing temperature is preferably 100 to 300° C. from the viewpoints of increasing the crosslinking density of the photosensitive resin composition film, enabling removal of residual volatile components, as well as adhesive force to the substrate, heat resistance, strength, and also electric characteristics. The post-curing time can be 10 minutes to 10 hours.

The formed pattern is used for a protective film for covering wirings, circuits, substrates, and the like. These formed pattern and protective film have excellent insulating property and also exhibit excellent adhesive force onto a metal layer such as Cu in a wiring and a circuit to be covered, onto a metal electrode present on the substrate, or onto an insulating substrate such as SiN present in a wiring and a circuit to be covered. Furthermore, the formed pattern and protective film make it possible to remarkably improve the resolution performance for enabling a finer pattern formation, while having appropriate mechanical strength as a protective film.

The cured film thus obtained is excellent in adhesiveness to the substrate, heat resistance, electric characteristics, mechanical strength and chemical resistance to an alkaline peeling solution and the like. Moreover, a semiconductor device using the cured film as a protective film also has excellent reliability. Particularly, it is possible to prevent cracks in the temperature cycle test, whereby the cured film is suitably used as a surface protective film for electric and electronic parts, semiconductor devices, and the like.

Because of the heat resistance, chemical resistance, and insulating property, the film for protection is effective for an insulating film for a semiconductor device including rewiring use, an insulating film for a multilayer printed board, a solder mask, a cover lay film use, and the like.

EXAMPLES

Hereinafter, the present Invention will be specifically described by referring to Synthesis Examples, Comparative Synthesis Examples, Examples, and Comparative Examples. However, the present invention is not limited by the following examples.

I. Synthesis of Polyimide Resin

Chemical structure formulae of the compounds used in the following Synthesis Examples are shown below.

Next, 100 g of a saturated aqueous solution of ammonium chloride was added to stop the reaction. To the reaction solution, 200 g of ethyl acetate and 100 g of ultrapure water were added. After liquid separation and water-washing, the organic layer was collected by separation and then further washed four times with 100 g of ultrapure water. The solvent

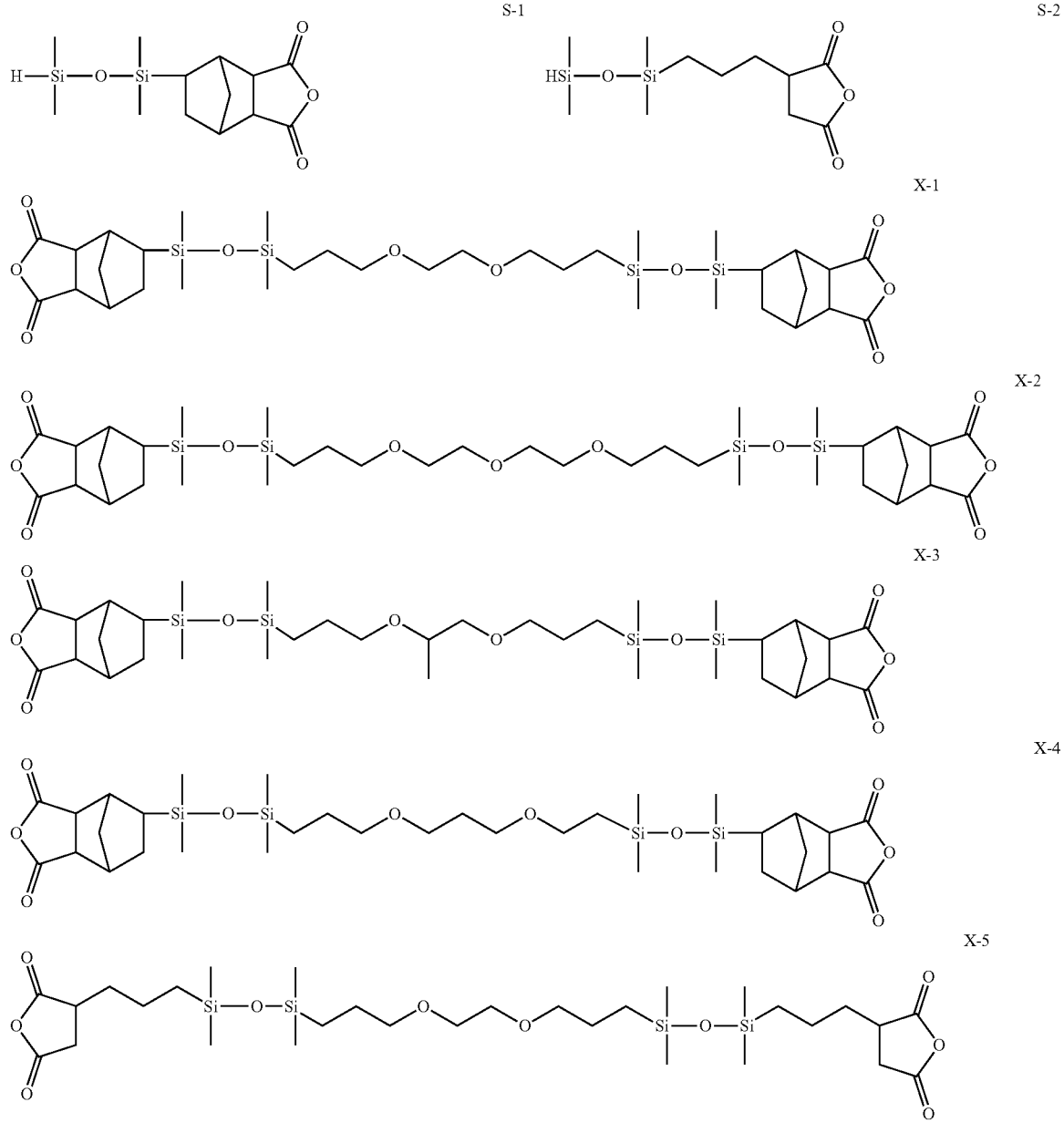

[Synthesis Example 1] Synthesis of Ethylene Glycol Diallyl Ether

Into a 1-L flask equipped with a stirrer and a thermometer, 26.4 g (1.1 mol) of sodium hydride and 100 g of tetrahydrofuran were charged. While the mixture was being stirred at room temperature, 31.0 g (0.5 mol) of ethylene glycol was added dropwise thereto, and then stirred under room temperature for 2 hours. Subsequently, 242.0 g (2.0 mol) of allyl bromide was added dropwise thereto. After completion of the dropwise addition, the mixture was stirred for 1 hour.

of the obtained organic layer was distilled off, and the resultant was purified by distillation. Thus, 60 g of ethylene glycol diallyl ether was obtained.

[Synthesis Example 2] Synthesis of Diethylene Glycol Diallyl Ether

In the same manner as in Synthesis Example 1 except for changing ethylene glycol to 53.1 g of diethylene glycol, 82.0 g of diethylene glycol diallyl ether was obtained.

[Synthesis Example 3] Synthesis of Propylene Glycol Diallyl Ether

In the same manner as in Synthesis Example 1 except for changing ethylene glycol to 38.1 g of propylene glycol, 70.3 g of propylene glycol diallyl ether was obtained.

[Synthesis Example 4] Synthesis of 1,3-diallyloxypropane

In the same manner as in Synthesis Example 1 except for changing ethylene glycol to 38.1 g of 1,3-propanediol, 68.7 g of 1,3-diallyloxypropane was obtained.

[Synthesis Example 5] Synthesis of Acid Anhydride-Containing Siloxane (S-1)

Into a 1-L flask equipped with a stirrer, a thermometer, and a reflux condenser, 50 g (0.31 mol) of 5-norbornene-2,3-dicarboxylic anhydride, 492 g (3.66 mol) of 1,1,3,3-tetramethyldisiloxane, 0.6 g ($0.6 \times 10^{-4}$ mol) of a 2-propanol solution containing 2 mass % platinum of chloroplatinic acid, and 150 g of xylene were charged and heated until the internal temperature reached 80° C. The mixture was stirred for 7 hours. After cooling to room temperature, excessive 1,1,3,3-tetramethyldisiloxane and xylene were distilled off. The resultant was purified by distillation. Thus, 77.3 g of an acid anhydride-containing siloxane (S-1) was obtained.

[Synthesis Example 6] Synthesis of Acid Anhydride-Containing Siloxane (S-2)

In the same manner as in Synthesis Example 5 except for changing 5-norbornene-2,3-dicarboxylic anhydride to 42.7 g of allylsuccinic anhydride, 77.0 g of an acid anhydride-containing siloxane (S-2) was obtained.

[Synthesis Example 7] Synthesis of Tetracarboxylic Dianhydride (X-1)

Into a 500-ml flask equipped with a stirrer, a thermometer, and a reflux condenser, 50 g (168 mmol) of the acid anhydride-containing siloxane (S-1) obtained in Synthesis Example 5, 0.16 g ($0.16 \times 10^{-4}$ mol) of a 2-propanol solution containing 2 mass % platinum of chloroplatinic acid, and 200 g of xylene were charged. After the temperature was increased to 80° C., 11.6 g (82 mmol) of the ethylene glycol diallyl ether obtained in Synthesis Example 1 was added dropwise to the mixture. After completion of the dropwise addition, the temperature was increased to 90° C., and the mixture was stirred for 2 hours. The resultant was cooled to room temperature and 0.6 g of activated carbon was added thereto. After stirring for 1 hour, the activated carbon was separated by filtration, and the solvent was distilled off. Thus, 59.1 g of a tetracarboxylic dianhydride (X-1) was obtained.

[Synthesis Example 8] Synthesis of Tetracarboxylic Dianhydride (X-2)

In the same manner as in Synthesis Example 7 except for changing the ethylene glycol diallyl ether to 15.2 g of the diethylene glycol diallyl ether obtained in Synthesis Example 2, 62.6 g of a tetracarboxylic dianhydride (X-2) was obtained.

[Synthesis Example 9] Synthesis of Tetracarboxylic Dianhydride (X-3)

In the same manner as in Synthesis Example 7 except for changing the ethylene glycol diallyl ether to 12.7 g of the propylene glycol diallyl ether obtained in Synthesis Example 3, 60.2 g of a tetracarboxylic dianhydride (X-3) was obtained.

[Synthesis Example 10] Synthesis of Tetracarboxylic Dianhydride (X-4)

In the same manner as in Synthesis Example 7 except for changing the ethylene glycol diallyl ether to 12.7 g of the 1,3-diallyloxypropane obtained in Synthesis Example 4, 60.8 g of a tetracarboxylic dianhydride (X-4) was obtained.

[Synthesis Example 11] Synthesis of Tetracarboxylic Dianhydride (X-5)

In the same manner as in Synthesis Example 7 except for changing the acid anhydride-containing siloxane (S-1) to 46.1 g of the acid anhydride-containing siloxane (S-2) obtained in Synthesis Example 6, 55.3 g of a tetracarboxylic dianhydride (X-5) was obtained.

[Synthesis Example 12] Synthesis of Polyimide Resin (A-1)

Into a 500-ml flask equipped with a stirrer and a thermometer, 30 g (81.9 mmol) of 2,2-bis(3-amino-4-hydroxyphenyl)hexafluoropropane and 120 g of N-methyl-2-pyrrolidone were charged and stirred at room temperature to dissolve the material. Next, to this solution, a solution obtained by dissolving 15.2 g (49.1 mmol) of 3,3',4,4'-oxydiphthalic dianhydride (ODPA) and 24.2 g (32.8 mmol) of the tetracarboxylic dianhydride (X-1) synthesized in Synthesis Example 7 into 155 g of N-methyl-2-pyrrolidone was added dropwise under room temperature. After completion of the dropwise addition, the mixture was stirred under room temperature for 3 hours. Then, 40 g of xylene was added to this reaction solution, and heated under reflux for 6 hours while the formed water was being removed out of the system at 180° C. After cooling to room temperature, the reaction solution was added dropwise to 2 L of ultrapure water under stirring. The precipitates were collected by filtration, appropriately washed with water, and then dried under reduced pressure at 40° C. for 48 hours. Thus, a polyimide resin (A-1) was obtained. The molecular weight of this polymer was measured by GPC, and the weight average molecular weight was 32,000 in terms of polystyrene.

[Synthesis Example 13] Synthesis of Polyimide Resin (A-2)

In the same manner as in Synthesis Example 12 except for changing the tetracarboxylic dianhydride (X-1) to 25.7 g (32.8 mmol) of the tetracarboxylic dianhydride (X-2) obtained in Synthesis Example 8, a polyimide resin (A-2) was obtained. The molecular weight of this polymer was measured by GPC, and the weight average molecular weight was 33,000 in terms of polystyrene.

[Synthesis Example 14] Synthesis of Polyimide Resin (A-3)

In the same manner as in Synthesis Example 12 except for changing the tetracarboxylic dianhydride (X-1) to 24.7 g (32.8 mmol) of the tetracarboxylic dianhydride (X-3) obtained in Synthesis Example 9, a polyimide resin (A-3) was obtained. The molecular weight of this polymer was measured by GPC, and the weight average molecular weight was 30,000 in terms of polystyrene.

[Synthesis Example 15] Synthesis of Polyimide Resin (A-4)

In the same manner as in Synthesis Example 12 except for changing the tetracarboxylic dianhydride (X-1) to 24.7 g (32.8 mmol) of the tetracarboxylic dianhydride (X-4) obtained in Synthesis Example 10, a polyimide resin (A-4) was obtained. The molecular weight of this polymer was measured by GPC, and the weight average molecular weight was 31,000 in terms of polystyrene.

[Synthesis Example 16] Synthesis of Polyimide Resin (A-5)

In the same manner as in Synthesis Example 12 except for changing the tetracarboxylic dianhydride (X-1) to 22.7 g (32.8 mmol) of the tetracarboxylic dianhydride (X-5) obtained in Synthesis Example 11, a polyimide resin (A-5) was obtained. The molecular weight of this polymer was measured by GPC, and the weight average molecular weight was 29,000 in terms of polystyrene.

[Synthesis Example 17] Synthesis of Polyimide Resin (A-6)

Into a 500-ml flask equipped with a stirrer and a thermometer, 27.0 g (73.7 mmol) of 2,2-bis(3-amino-4-hydroxyphenyl)hexafluoropropane, 2.4 g (8.2 mmol) of 1,3-bis(3-aminophenoxy)benzene, and 120 g of N-methyl-2-pyrrolidone were charged and stirred at room temperature to dissolve the material. Next, to this solution, a solution obtained by dissolving 15.2 g (49.1 mmol) of 3,3',4,4'-oxydiphthalic dianhydride (ODPA) and 24.2 g (32.8 mmol) of the tetracarboxylic dianhydride (X-1) synthesized in Synthesis Example 7 into 155 g of N-methyl-2-pyrrolidone was added dropwise under room temperature. After completion of the dropwise addition, the mixture was stirred under room temperature for 3 hours. Then, 40 g of xylene was added to this reaction solution, and heated under reflux for 6 hours while the formed water was being removed out of the system at 180° C. After cooling to room temperature, the reaction solution was added dropwise to 2 L of ultrapure water under stirring. The precipitates were collected by filtration, appropriately washed with water, and then dried under reduced pressure at 40° C. for 48 hours. Thus, a polyimide resin (A-6) was obtained. The molecular weight of this polymer was measured by GPC, and the weight average molecular weight was 34,000 in terms of polystyrene.

[Comparative Synthesis Example 1] Synthesis of Polyamide Imideresin (A-7)

Into a 500-ml flask equipped with a stirrer and a thermometer, 30 g (81.9 mmol) of 2,2-bis(3-amino-4-hydroxyphenyl)hexafluoropropane and 170 g of N-methyl-2-pyrrolidone were charged and stirred at room temperature to dissolve the material. Next, to this solution, a solution obtained by dissolving 15.2 g (49.1 mmol) of 3,3',4,4'-oxydiphthalic dianhydride (s-ODPA) into 154 g of N-methyl-2-pyrrolidone was added dropwise under room temperature. After completion of the dropwise addition, the mixture was stirred under room temperature for 3 hours. Then, 40 g of xylene was added to this reaction solution, and heated under reflux for 3 hours while the formed water was being removed out of the system at 160° C. After cooling to room temperature, a mixed liquid containing 7.8 g (32.8 mmol) of sebacic acid dichloride was added dropwise while the temperature of the liquid was maintained at 5° C. or less. After completion of the dropwise addition, the temperature of the mixture was returned to room temperature, and the resulting reaction solution was added dropwise to 2 L of ultrapure water under stirring. The precipitates were collected by filtration, appropriately washed with water, and then dried under reduced pressure at 40° C. for 48 hours. Thus, a polyamide imide resin (A-7) was obtained. The molecular weight of this polymer was measured by GPC, and the weight average molecular weight was 35,000 in terms of polystyrene.

[Comparative Synthesis Example 2] Synthesis of Polyamide Imide Resin (A-8)

Into a 500-ml flask equipped with a stirrer and a thermometer, 24 g (65.5 mmol) of 2,2-bis(3-amino-4-hydroxyphenyl)hexafluoropropane, 4.8 g (16.4 mmol) of 1,3-bis(3-aminophenoxy)benzene, and 170 g of N-methyl-2-pyrrolidone were charged and stirred at room temperature to dissolve the material. Next, to this solution, a solution obtained by dissolving 15.2 g (49.1 mmol) of 3,3',4,4'-oxydiphthalic dianhydride (s-ODPA) into 154 g of N-methyl-2-pyrrolidone was added dropwise under room temperature. After completion of the dropwise addition, the mixture was stirred under room temperature for 3 hours. Then, 40 g of xylene was added to this reaction solution, and heated under reflux for 3 hours while the formed water was being removed out of the system at 160° C. After cooling to room temperature, a mixed liquid containing 7.8 g (32.8 mmol) of sebacic acid dichloride was added dropwise while the temperature of the liquid was maintained at 5° C. or less. After completion of the dropwise addition, the temperature of the mixture was returned to room temperature, and the resulting reaction solution was added dropwise to 2 L of ultrapure water under stirring. The precipitates were collected by filtration, appropriately washed with water, and then dried under reduced pressure at 40° C. for 48 hours. Thus, a polyamide imide resin (A-8) was obtained. The molecular weight of this polymer was measured by GPC, and the weight average molecular weight was 37,000 in terms of polystyrene.

II. Preparation of Photosensitive Resin Composition

The polymers synthesized in Synthesis Examples 12 to 17 and Comparative Synthesis Examples 1, 2 were used to prepare resin compositions each having a resin content of 40% by mass with the compositions and formulation amounts shown in Tables 1 to 3. Then, the components were stirred, mixed, dissolved, and subsequently subjected to precise filtration with a 0.5 μm filter made of Teflon (registered trademark) to obtain photosensitive resin compositions. In the table, GBL of the solvent represents γ-butyrolactone.

TABLE 1

| | Photo-sensitive resin composition 1 | Photo-sensitive resin composition 2 | Photo-sensitive resin composition 3 | Photo-sensitive resin composition 4 | Photo-sensitive resin composition 5 | Photo-sensitive resin composition 6 | Comparative photo-sensitive resin composition 1 | Comparative photo-sensitive resin composition 2 |
|---|---|---|---|---|---|---|---|---|
| Base resin | A-1 100 parts by weight | A-2 100 parts by weight | A-3 100 parts by weight | A-4 100 parts by weight | A-5 100 parts by weight | A-6 100 parts by weight | A-7 100 parts by weight | A-8 100 parts by weight |
| Photo-sensitive agent | Photo-sensitive agent 1 15 parts by weight | Photo-sensitive agent 1 15 parts by weight | Photo-sensitive agent 1 15 parts by weight | Photo-sensitive agent 1 15 parts by weight | Photo-sensitive agent 1 15 parts by weight | Photo-sensitive agent 1 15 parts by weight | Photo-sensitive agent 1 15 parts by weight | Photo-sensitive agent 1 15 parts by weight |
| Solvent | GBL 150 parts by weight | GBL 150 parts by weight | GBL 150 parts by weight | GBL 150 parts by weight | GBL 150 parts by weight | GBL 150 parts by weight | GBL 150 parts by weight | GBL 150 parts by weight |

The photosensitive resin compositions 1 to 6 shown in Table 1 relate to the above-described positive type photosensitive resin composition of the first embodiment according to the present invention. The comparative photosensitive resin compositions 1, 2 use the polyamide imide resins synthesized in Comparative Synthesis Examples 1, 2 as base resins in place of the polyimide resin of the present invention in the positive type photosensitive resin composition of the present invention.

TABLE 2

| | Photo-sensitive resin composition 7 | Photo-sensitive resin composition 8 | Photo-sensitive resin composition 9 | Photo-sensitive resin composition 10 | Photo-sensitive resin composition 11 | Photo-sensitive resin composition 12 | Comparative photo-sensitive resin composition 3 | Comparative photo-sensitive resin composition 4 |
|---|---|---|---|---|---|---|---|---|
| Base resin | A-1 100 parts by weight | A-2 100 parts by weight | A-3 100 parts by weight | A-4 100 parts by weight | A-5 100 parts by weight | A-6 100 parts by weight | A-7 100 parts by weight | A-8 100 parts by weight |
| Photo-sensitive agent | Photo-sensitive agent 1 15 parts by weight | Photo-sensitive agent 1 15 parts by weight | Photo-sensitive agent 1 15 parts by weight | Photo-sensitive agent 1 15 parts by weight | Photo-sensitive agent 1 15 parts by weight | Photo-sensitive agent 1 15 parts by weight | Photo-sensitive agent 1 15 parts by weight | Photo-sensitive agent 1 15 parts by weight |
| Cross-linking agent | CL-1 5 parts by weight | CL-1 5 parts by weight | CL-1 5 parts by weight | CL-1 5 parts by weight | CL-1 5 parts by weight | CL-1 5 parts by weight | CL-1 5 parts by weight | CL-1 5 parts by weight |
| Cross-linking agent | CL-2 15 parts by weight | CL-2 15 parts by weight | CL-2 15 parts by weight | CL-2 15 parts by weight | CL-2 15 parts by weight | CL-2 15 parts by weight | CL-2 15 parts by weight | CL-2 15 parts by weight |
| Solvent | GBL 150 parts by weight | GBL 150 parts by weight | GBL 150 parts by weight | GBL 150 parts by weight | GBL 150 parts by weight | GBL 150 parts by weight | GBL 150 parts by weight | GBL 150 parts by weight |

The photosensitive resin compositions 7 to 12 shown in Table 2 relate to the above-described positive type photosensitive resin composition of the second embodiment according to the present invention. The comparative photosensitive resin compositions 3, 4 use the polyamide imide resins synthesized in Comparative Synthesis Examples 1, 2 as base resins in place of the polyimide resin of the present invention in the positive type photosensitive resin composition of the present invention.

TABLE 3

| | Photosensitive resin composition 13 | Photosensitive resin composition 14 | Photosensitive resin composition 15 | Photosensitive resin composition 16 | Photosensitive resin composition 17 | Photosensitive resin composition 18 | Comparative photosensitive resin composition 5 | Comparative photosensitive resin composition 6 |
|---|---|---|---|---|---|---|---|---|
| Base resin | A-1 100 parts by weight | A-2 100 parts by weight | A-3 100 parts by weight | A-4 100 parts by weight | A-5 100 parts by weight | A-6 100 parts by weight | A-7 100 parts by weight | A-8 100 parts by weight |
| Photoacid generator | Acid generator 1 2 parts by weight | Acid generator 1 2 parts by weight | Acid generator 1 2 parts by weight | Acid generator 1 2 parts by weight | Acid generator 1 2 parts by weight | Acid generator 1 2 parts by weight | Acid generator 1 2 parts by weight | Acid generator 1 2 parts by weight |
| Crosslinking agent | CL-1 15 parts by weight | CL-1 15 parts by weight | CL-1 15 parts by weight | CL-1 15 parts by weight | CL-1 15 parts by weight | CL-1 15 parts by weight | CL-1 15 parts by weight | CL-1 15 parts by weight |
| Crosslinking agent | CL-2 15 parts by weight | CL-2 15 parts by weight | CL-2 15 parts by weight | CL-2 15 parts by weight | CL-2 15 parts by weight | CL-2 15 parts by weight | CL-2 15 parts by weight | CL-2 15 parts by weight |
| Solvent | GBL 150 parts by weight | GBL 150 parts by weight | GBL 150 parts by weight | GBL 150 parts by weight | GBL 150 parts by weight | GBL 150 parts by weight | GBL 150 parts by weight | GBL 150 parts by weight |

The photosensitive resin compositions 13 to 18 shown in Table 3 relate to the above-described negative type photosensitive resin composition of the present invention. The comparative photosensitive resin compositions 5, 6 use the polyamide imide resins synthesized in Comparative Synthesis Examples 1, 2 as base resins in place of the polyimide resin of the present invention in the negative type photosensitive resin composition of the present invention.

Details of the photoacid generator (acid generator 1), the photosensitive agent (photosensitive agent 1) which is a quinonediazide compound, and the crosslinking agents (CL-1), (CL-2) in Tables 1 to 3 are as follows.

Photoacid generator (acid generator 1)

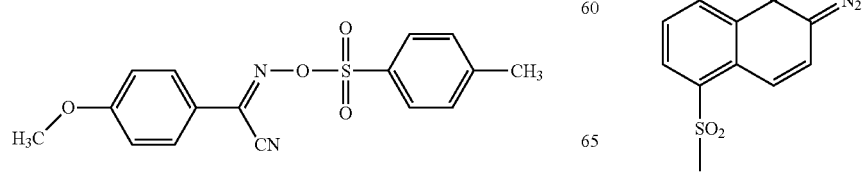

Photosensitive agent (photosensitive agent 1)

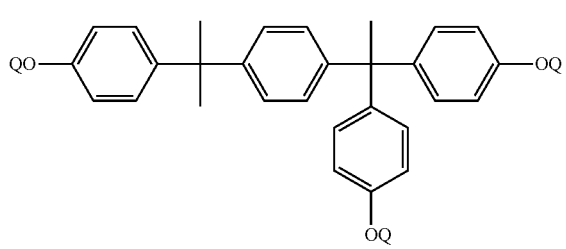

In the formula, Q represents a hydrogen atom or a 1,2-naphthoquinonediazide sulfonyl group shown by the following formula (25), and 90% of Qs are substituted by the 1,2-naphthoquinonediazide sulfonyl group shown by the following formula (25).

(25)

Crosslinking Agent (CL-1)

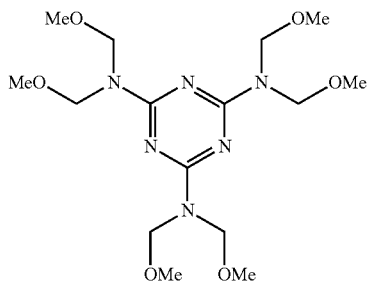 [SMILES: COCN(COC)c1nc(N(COC)COC)nc(N(COC)COC)n1]

Crosslinking Agent (CL-2)

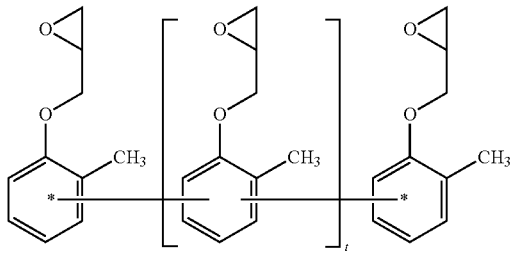

In the formula, "t" satisfies 2≤t≤3.

III. Pattern Formation

The photosensitive resin compositions 1 to 18 and the comparative photosensitive resin compositions 1 to 6 were each dispensed on a silicon substrate in an amount of 5 mL. Then, by rotating the substrate, that is, by a spin coating method, each photosensitive resin composition was coated so as to have a film thickness of 10 μm after heating for post-curing performed after the pattern formation. That is, it was examined beforehand that the film thickness would decrease after the post-curing step, and the rotational speed at the time of coating was adjusted such that the finished film thickness after the post-curing would be 10 μm.

Next, prebaking was performed on a hot plate at 120° C. for 3 minutes. Then, i line exposure and pattern formation were carried out using an i-line stepper NSR-2205i11 manufactured by Nikon Corporation. In the pattern formation, masks for the positive type pattern and the negative type pattern were appropriately used in accordance with the photosensitive resin composition used. The masks each have a pattern which can form a hole of 20 μm in lengthwise and breadthwise arrangement of 1:1, and can form a hole pattern with increments of: 10 μm from 50 μm to 20 μm, 5 μm from 20 μm to 10 μm, and 1 μm from 10 μm to 1 μm.

Next, the heating step was performed under the condition as shown in Tables 4 and 5 below.

In the development step, an aqueous alkaline solution was used as a developing solution; specifically, a 2.38% aqueous tetramethylammonium hydroxide solution was used as the developing solution. Paddle development with a 2.38% aqueous tetramethylammonium hydroxide (TMAH) solution for 1 minute was carried out with an appropriate number of times as shown in Tables 4 and 5, and then rinsing with ultrapure water was carried out.

Subsequently, the obtained pattern on the substrate was post-cured by using an oven at 200° C. for 2 hours while purging with nitrogen.

Next, in order to observe the shape of the obtained hole pattern, each substrate was cut out and the shape of the hole pattern was observed using a scanning electron microscope (SEM). The aperture diameter of the smallest opening hole in the film thickness of 10 μm after the post-curing was obtained, and the pattern shape was evaluated. Together with these results, Tables 4 and 5 show the sensitivity at which the minimum pattern was successfully formed.

The hole pattern shape was evaluated according to the following criteria. Tables 4 and 5 show the evaluation result.

Good: hole with a rectangular or forward tapered shape (the shape in which the dimension of the hole upper part is larger than the dimension of the bottom part) was observed Not good: hole with an inversely tapered shape (the shape in which the dimension of the hole upper part is smaller than the dimension of the bottom part) or overhang shape (the shape in which the hole upper part protrudes), or a residue at the bottom portion of a hole was observed Table 4 shows the results of patterning using the positive type photosensitive resin compositions (the photosensitive resin compositions 1 to 12, the comparative photosensitive resin compositions 1 to 4).

Table 5 shows the results of patterning using the negative type photosensitive resin compositions (the photosensitive resin compositions 13 to 18, the comparative photosensitive resin compositions 5, 6).

IV. Film Shrinkage

Each of the photosensitive resin compositions 1 to 18 and the comparative photosensitive resin compositions 1 to 6 was spin-coated onto a silicone wafer such that the finished film thickness after curing would be 10 μm. Next, prebaking was performed on a hot plate at 120° C. for 3 minutes, and a photosensitive resin film was obtained. Next, the film thickness of the obtained resin was measured with a spectrometric film thickness gauge (VM-1210 manufactured by Dainippon Screen Mfg. Co., Ltd.).

Then, the film was cured by using an oven at 200° C. for 2 hours while purging with nitrogen. Thereby, a photosensitive resin cured film was obtained. Next, the film thickness of the cured film thus obtained was measured with the spectrometric film thickness gauge. The difference in the film thickness between before and after the curing was divided by the film thickness after the prebaking, and the value expressed in percentage was considered as a cure shrinkage. The smaller the value, the smaller the shrinkage amount. The obtained numerical values were compared to evaluate the film shrinkage through the thermal curing. Tables 4 and 5 show the result.

TABLE 4

| | Composition | Pattern | Baking after exposure | Development conditions | Hole shape | Minimum hole diameter (μm) | Sensitivity (mJ/cm$^2$) | Cure shrinkage (%) |
|---|---|---|---|---|---|---|---|---|
| Example 1 | Photosensitive resin composition 1 | Positive type | None | Paddle 60 sec 3 times | Good | 6 | 440 | 12 |
| Example 2 | Photosensitive resin composition 2 | Positive type | None | Paddle 60 sec 3 times | Good | 6 | 460 | 12 |
| Example 3 | Photosensitive resin composition 3 | Positive type | None | Paddle 60 sec 3 times | Good | 6 | 460 | 12 |
| Example 4 | Photosensitive resin composition 4 | Positive type | None | Paddle 60 sec 3 times | Good | 6 | 440 | 12 |
| Example 5 | Photosensitive resin composition 5 | Positive type | None | Paddle 60 sec 3 times | Good | 6 | 440 | 12 |
| Example 6 | Photosensitive resin composition 6 | Positive type | None | Paddle 60 sec 3 times | Good | 6 | 420 | 12 |
| Example 7 | Photosensitive resin composition 7 | Positive type | None | Paddle 60 sec 3 times | Good | 5 | 320 | 10 |
| Example 8 | Photosensitive resin composition 8 | Positive type | None | Paddle 60 sec 3 times | Good | 5 | 360 | 10 |
| Example 9 | Photosensitive resin composition 9 | Positive type | None | Paddle 60 sec 3 times | Good | 5 | 340 | 10 |
| Example 10 | Photosensitive resin composition 10 | Positive type | None | Paddle 60 sec 3 times | Good | 5 | 340 | 10 |
| Example 11 | Photosensitive resin composition 11 | Positive type | None | Paddle 60 sec 3 times | Good | 5 | 320 | 10 |
| Example 12 | Photosensitive resin composition 12 | Positive type | None | Paddle 60 sec 3 times | Good | 5 | 300 | 10 |
| Comparative Example 1 | Comparative photosensitive resin composition 1 | Positive type | None | Paddle 60 sec 3 times | Good | 7 | 440 | 15 |
| Comparative Example 2 | Comparative photosensitive resin composition 2 | Positive type | None | Paddle 60 sec 3 times | Good | 7 | 420 | 15 |
| Comparative Example 3 | Comparative photosensitive resin composition 3 | Positive type | None | Paddle 60 sec 3 times | Good | 7 | 380 | 15 |
| Comparative Example 4 | Comparative photosensitive resin composition 4 | Positive type | None | Paddle 60 sec 3 times | Good | 7 | 360 | 15 |

As shown in Table 4, the positive type photosensitive resin compositions of the present invention showed good pattern shapes in the development with the alkali solvent and exhibited small values in the minimum hole dimension as compared with the finished film thickness of 10 μm. These suggested that the aspect ratio of 1 to 2 is achievable.

On the other hand, in Table 4, the comparative photosensitive resin compositions 1 to 4 used in Comparative Examples 1 to 4 can be prepared in the same manner as the positive type photosensitive resin composition of the first embodiment or the second embodiment according to the present invention, and good patterns can be obtained by the development with an alkali. However, in comparison with the positive type photosensitive compositions of the present invention, the film thicknesses greatly decreased after the post-curing step, so that the aspect ratio of 2 was not achieved.

TABLE 5

| | Composition | Pattern | Baking after exposure | Development Conditions | Hole shape | Minimum hole diameter (μm) | Sensitivity (mJ/cm²) | Cure shrinkage (%) |
|---|---|---|---|---|---|---|---|---|
| Example 13 | Photosensitive resin composition 13 | Negative type | 100° C. × 120 sec. | Paddle 60 sec 3 times | Good | 8 | 660 | 10 |
| Example 14 | Photosensitive resin composition 14 | Negative type | 100° C. × 120 sec. | Paddle 60 sec 3 times | Good | 8 | 660 | 10 |
| Example 15 | Photosensitive resin composition 15 | Negative type | 100° C. × 120 sec. | Paddle 60 sec 3 times | Good | 8 | 680 | 10 |
| Example 16 | Photosensitive resin composition 16 | Negative type | 100° C. × 120 sec. | Paddle 60 sec 3 times | Good | 8 | 660 | 10 |
| Example 17 | Photosensitive resin composition 17 | Negative type | 100° C. × 120 sec. | Paddle 60 sec 3 times | Good | 8 | 660 | 10 |
| Example 18 | Photosensitive resin composition 18 | Negative type | 100° C. × 120 sec. | Paddle 60 sec 3 times | Good | 8 | 640 | 10 |
| Comparative Example 5 | Comparative photosensitive resin composition 5 | Negative type | 100° C. × 120 sec. | Paddle 60 sec 3 times | Good | 10 | 620 | 15 |
| Comparative Example 6 | Comparative photosensitive resin composition 6 | Negative type | 100° C. × 120 sec. | Paddle 60 sec 3 times | Good | 10 | 640 | 15 |

As shown in Table 5, the negative type photosensitive resin compositions of the present invention showed good pattern shapes in the development with the alkali solvent and exhibited small values in the minimum hole dimension as compared with the finished film thickness of 10 μm. These suggested that the aspect ratio of 1 or more is achievable.

On the other hand, in Table 5, the comparative photosensitive resin compositions 5, 6 used in Comparative Examples 5, 6 can be prepared in the same manner as the negative type photosensitive resin composition of the present invention, and good patterns can be obtained by the development with an alkali. However, in comparison with the negative type photosensitive compositions of the present invention, the film thicknesses greatly decreased after the post-curing step. As a result, the aspect ratio was inferior.

V. Adhesiveness

Each of the photosensitive resin compositions 7 to 18 and the comparative photosensitive resin compositions 3 to 6 was spin-coated onto a copper-plated substrate such that the finished film thickness after curing would be 10 μm. Next, prebaking was performed on a hot plate at 120° C. for 3 minutes. Then, the film was cured by using an oven at 200° C. for 2 hours while purging with nitrogen. Thereby, a photosensitive resin cured film was obtained.

Next, the substrate was cut out into a 1×1 cm square. Then, an aluminum pin with epoxy adhesive was fastened to the cut substrate by using a dedicated jig. Subsequently, the assembly was heated using an oven at 150° C. for 1 hour to bond the aluminum pin to the surface of the cured film. After cooling to room temperature, the adhesion strength to the substrate was evaluated by a tensile test using a thin-film adhesion strength measurement apparatus (Romulus IV manufactured by Quad Group Inc.). As the measurement condition, the measurement speed was 20 N/sec. The FIGURE is an explanatory view for illustrating the adhesive force measurement method. In the FIGURE, reference number 1 denotes a copper-plated substrate (substrate), 2 denotes a cured film, 3 denotes an aluminum pin with adhesive, 4 denotes a support, 5 denotes a grip, and 6 denotes a tensile direction. The obtained value was an average value of ten measurement points. The larger the numerical value, the higher the adhesiveness of the cured film to the copper-plated substrate. In addition, the adhesive force at the peeling interface of cured film/adhesive is higher than that of substrate/cured film. The obtained numerical values and the peeling interfaces were compared to evaluate the adhesiveness. Table 6 shows the result.

TABLE 6

| | Composition | Adhesive force (MPa) | Peeling interface |
|---|---|---|---|
| Example 19 | Photosensitive resin composition 7 | 55 | Cured film/adhesive |
| Example 20 | Photosensitive resin composition 8 | 60 | cured film/adhesive |
| Example 21 | Photosensitive resin composition 9 | 54 | cured film/adhesive |
| Example 22 | Photosensitive resin composition 10 | 57 | cured film/adhesive |
| Example 23 | Photosensitive resin composition 11 | 56 | cured film/adhesive |
| Example 24 | Photosensitive resin composition 12 | 53 | cured film/adhesive |
| Example 25 | Photosensitive resin composition 13 | 64 | cured film/adhesive |
| Example 26 | Photosensitive resin composition 14 | 65 | cured film/adhesive |
| Example 27 | Photosensitive resin composition 15 | 63 | cured film/adhesive |
| Example 28 | Photosensitive resin composition 16 | 64 | cured film/adhesive |
| Example 29 | Photosensitive resin composition 17 | 64 | cured film/adhesive |

TABLE 6-continued

| | Composition | Adhesive force (MPa) | Peeling interface |
|---|---|---|---|
| Example 30 | Photosensitive resin composition 18 | 62 | cured film/adhesive |
| Comparative Example 7 | Comparative photosensitive resin composition 3 | 43 | Substrate/cured film |
| Comparative Example 8 | Comparative photosensitive resin composition 4 | 40 | Substrate/cured film |
| Comparative Example 9 | Comparative photosensitive resin composition 5 | 45 | Substrate/cured film |
| Comparative Example 10 | Comparative photosensitive resin composition 6 | 44 | Substrate/cured film |

As shown in Table 6, the photosensitive resin compositions of the present invention exhibited good adhesive forces. Since the peeling interfaces were cured film/adhesive, the adhesiveness to the copper-plated substrate was also good.

On the other hand, the comparative photosensitive resin compositions exhibited low adhesive forces in comparison with the photosensitive compositions of the present invention. Since the peeling interfaces were substrate/cured film, sufficient adhesiveness to the copper plating was not obtained.

It should be noted that the present invention is not restricted to the above-described embodiments. The embodiments are merely examples so that any embodiments that have substantially the same feature and demonstrate the same functions and effects as those in the technical concept as disclosed in claims of the present invention are included in the technical range of the present invention.

What is claimed is:

1. A tetracarboxylic dianhydride shown by the following general formula (1),

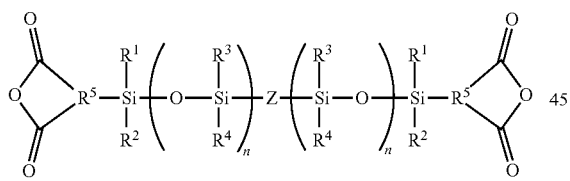

(1)

wherein Z represents a linear or branched divalent hydrocarbon group having 4 to 100 carbon atoms optionally containing an oxygen atom therein; $R^1$ to $R^4$ each represent an identical or different monovalent hydrocarbon group having 1 to 8 carbon atoms; $R^5$ represents a trivalent organic group; and "n" represents an integer of 1 to 100.

2. The tetracarboxylic dianhydride according to claim 1, wherein $R^5$ in the general formula (1) is shown by the following general formula (2) or (3),

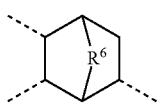

(2)

wherein $R^6$ represents a methylene group or an oxygen atom, and

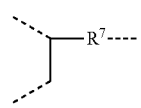

(3)

wherein $R^7$ represents a linear or branched alkylene group or alkenylene group having 3 to 15 carbon atoms.

3. The tetracarboxylic dianhydride according to claim 1, wherein Z in the general formula (1) is a divalent organic group shown by the following general formula (4),

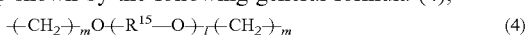

(4)

wherein $R^{15}$ represents a linear or branched alkylene group having 2 to 15 carbon atoms; "l" represents an integer of 1 to 50; and "m" represents an integer of 2 to 15.

4. A polyimide resin comprising a structural unit shown by the following general formula (5),

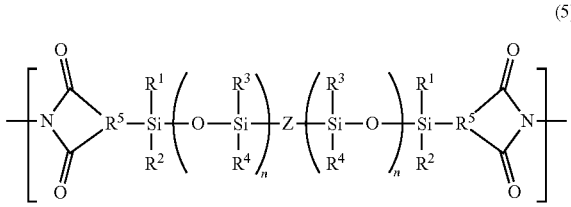

(5)

wherein Z represents a linear or branched divalent hydrocarbon group having 4 to 100 carbon atoms optionally containing an oxygen atom therein; $R^1$ to $R^4$ each represent an identical or different monovalent hydrocarbon group having 1 to 8 carbon atoms; $R^5$ represents a trivalent organic group; "n" represents an integer of 1 to 100; and X represents a divalent organic group.

5. The polyimide resin according to claim 4, wherein X in the general formula (5) is a divalent organic group shown by the following general formula (6),

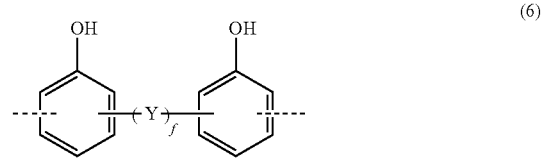

(6)

wherein "f" represents 0 or 1; Y represents a divalent bonding group; and f=0 represents direct bonding without a bonding group.

6. The polyimide resin according to claim 5, wherein Y in the general formula (6) is a divalent group shown by the following formula (7) or (8),

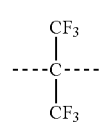

(7)

(8)

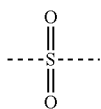

7. A method for producing the polyimide resin according to claim 4, the method comprising reacting a tetracarboxylic dianhydride shown by the following general formula (1) with a diamine shown by the following general formula (9), (1)

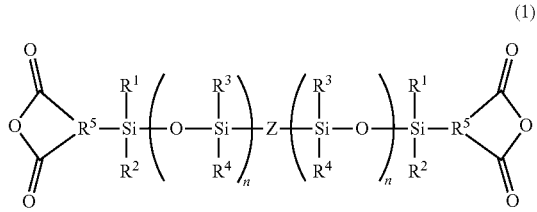

wherein Z represents a linear or branched divalent hydrocarbon group having 4 to 100 carbon atoms optionally containing an oxygen atom therein; $R^1$ to $R^4$ each represent an identical or different monovalent hydrocarbon group having 1 to 8 carbon atoms; $R^5$ represents a trivalent organic group; and "n" represents an integer of 1 to 100, $$H_2N—X—NH_2 \quad (9)$$

wherein X is as defined above.

8. A positive type photosensitive resin composition comprising:
  (A) the polyimide resin according to claim 4;
  (B) a photosensitive agent which generates an acid by light to increase a dissolution rate in an aqueous alkaline solution and is a compound having a quinonediazide structure; and
  (D) a solvent.

9. A positive type photosensitive resin composition comprising:
  (A) the polyimide resin according to claim 4;
  (B) the photosensitive agent which generates an acid by light to increase a dissolution rate in an aqueous alkaline solution and is a compound having a quinonediazide structure;
  (C) at least one of a crosslinking agent(s) selected from an amino condensate modified by formaldehyde or formaldehyde-alcohol, a phenol compound having two or more methylol groups or alkoxymethylol groups in one molecule on average, a compound in which a hydrogen atom of a hydroxyl group of a polyvalent phenol is substituted by a glycidyl group or a group having a glycidyl group, a compound in which a hydrogen atom of a hydroxyl group of a polyvalent phenol is substituted by a substituent shown by the following formula (C-1), and a compound containing two or more groups each shown by the following formula (C-2) or (C-2'), (C-1)

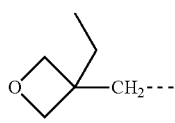

(C-2)

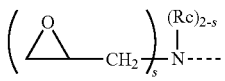

(C-2')

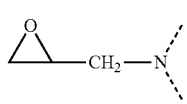

wherein a dotted line represents a bond; Rc represents a linear, branched, or cyclic alkyl group having 1 to 6 carbon atoms; and "s" represents 1 or 2; and
  (D) a solvent.

10. A negative type photosensitive resin composition comprising:
  (A') the polyimide resin according to claim 4;
  (B') a photoacid generator;
  (C') at least one of a crosslinking agent(s) selected from an amino condensate modified by formaldehyde or formaldehyde-alcohol, a phenol compound having two or more methylol groups or alkoxymethylol groups in one molecule on average, a compound in which a hydrogen atom of a hydroxyl group of a polyvalent phenol is substituted by a glycidyl group or a group having a glycidyl group, a compound in which a hydrogen atom of a hydroxyl group of a polyvalent phenol is substituted by a substituent shown by the following formula (C-1), and a compound containing two or more groups each shown by the following formula (C-2) or (C-2'), (C-1)

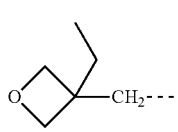

(C-2)

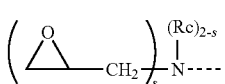

(C-2')

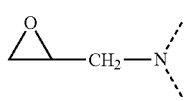

wherein a dotted line represents a bond; Rc represents a linear, branched, or cyclic alkyl group having 1 to 6 carbon atoms; and "s" represents 1 or 2; and
  (D) a solvent.

11. A patterning process comprising the steps of:
  (1) coating the positive type photosensitive resin composition according to claim 8 onto a substrate to form a film of a photosensitive material;
  (2) after heat treatment, exposing the film of the photosensitive material by a high energy beam with a wavelength of 190 to 500 nm or an electron beam through a photomask; and
  (3) developing the film using a developing solution of an aqueous alkaline solution.

12. A patterning process comprising the steps of:
(1) coating the positive type photosensitive resin composition according to claim 9 onto a substrate to form a film of a photosensitive material;
(2) after heat treatment, exposing the film of the photosensitive material by a high energy beam with a wavelength of 190 to 500 nm or an electron beam through a photomask; and
(3) developing the film using a developing solution of an aqueous alkaline solution.

13. A patterning process comprising the steps of:
(I) coating the negative type photosensitive resin composition according to claim 10 onto a substrate to form a film of a photosensitive material;
(II) after heat treatment, exposing the film of the photosensitive material by a high energy beam with a wavelength of 190 to 500 nm or an electron beam through a photomask; and
(III) developing the film using a developing solution of an aqueous alkaline solution.

14. The patterning process according to claim 13, further comprising a heating step after the exposure between the step (II) and the step (III).

15. A method for forming a cured film, comprising heating and post-curing the patterned film obtained by the patterning process according to claim 11, at a temperature of 100 to 300° C.

16. A method for forming a cured film, comprising heating and post-curing the patterned film obtained by the patterning process according to claim 12, at a temperature of 100 to 300° C.

17. A method for forming a cured film, comprising heating and post-curing the patterned film obtained by the patterning process according to claim 13, at a temperature of 100 to 300° C.

18. An interlayer insulating film comprising a cured film in which the positive type photosensitive resin composition according to claim 8 has cured.

19. A surface protective film comprising a cured film in which the positive type photosensitive resin composition according to claim 8 has cured.

20. An electronic part comprising the interlayer insulating film according to claim 18.

* * * * *